US009620190B2

(12) United States Patent
Lee et al.

(10) Patent No.: US 9,620,190 B2
(45) Date of Patent: Apr. 11, 2017

(54) SEMICONDUCTOR RESISTIVE MEMORY DEVICES INCLUDING SEPARATELY CONTROLLABLE SOURCE LINES

(71) Applicant: Samsung Electronics Co., Ltd., Suwon-Si, Gyeonggi-do (KR)

(72) Inventors: Jaekyu Lee, Yongin-si (KR); Kiseok Suh, Hwaseong-si (KR)

(73) Assignee: Samsung Electronics Co., Ltd. (KR)

( * ) Notice: Subject to any disclaimer, the term of this patent is extended or adjusted under 35 U.S.C. 154(b) by 0 days.

(21) Appl. No.: 14/609,977

(22) Filed: Jan. 30, 2015

(65) Prior Publication Data
US 2015/0294695 A1    Oct. 15, 2015

(30) Foreign Application Priority Data

Apr. 14, 2014  (KR) .................. 10-2014-0044336

(51) Int. Cl.
| | | |
|---|---|---|
| *G11C 11/16* | (2006.01) | |
| *G11C 13/00* | (2006.01) | |
| *G11C 13/02* | (2006.01) | |

(52) U.S. Cl.
CPC ............ *G11C 11/165* (2013.01); *G11C 11/16* (2013.01); *G11C 11/1659* (2013.01); *G11C 13/0002* (2013.01); *G11C 13/003* (2013.01); *G11C 13/0004* (2013.01); *G11C 13/0007* (2013.01); *G11C 13/0021* (2013.01); *G11C 13/025* (2013.01); *G11C 2213/52* (2013.01); *G11C 2213/79* (2013.01); *G11C 2213/82* (2013.01)

(58) Field of Classification Search
CPC ... G11C 11/165; G11C 11/1659; G11C 11/16; G11C 13/0002; G11C 13/0004; G11C 13/0007; G11C 13/003; G11C 13/025; G11C 13/0021; G11C 2213/52; G11C 2213/79; G11C 2213/82
USPC ................................ 365/158, 171, 173, 148
See application file for complete search history.

(56) References Cited

U.S. PATENT DOCUMENTS

| | | | |
|---|---|---|---|
| 5,124,945 A * | 6/1992 | Schreck ................. | G11C 16/10 365/185.11 |
| 6,757,191 B2 | 6/2004 | Ooishi et al. | |
| 6,788,571 B2 | 9/2004 | Ooishi et al. | |
| 7,995,378 B2 | 8/2011 | Yoon et al. | |
| 8,107,285 B2 | 1/2012 | Worledge | |
| 8,144,509 B2 * | 3/2012 | Jung ....................... | G11C 11/16 365/148 |
| 8,208,290 B2 | 6/2012 | Rao et al. | |
| 8,432,727 B2 * | 4/2013 | Ryu ........................ | G11C 11/16 365/148 |
| 2002/0126550 A1 * | 9/2002 | Sugio ....................... | G11C 7/16 365/200 |
| 2004/0125650 A1 * | 7/2004 | Tsuji ....................... | G11C 11/16 365/173 |
| 2008/0049487 A1 * | 2/2008 | Yoshimura .............. | G11C 11/22 365/148 |
| 2008/0067573 A1 * | 3/2008 | Jang ..................... | H01L 21/8221 257/315 |

(Continued)

*Primary Examiner* — Vu Le
*Assistant Examiner* — Sung Cho
(74) *Attorney, Agent, or Firm* — Ward and Smith, P.A.

(57) ABSTRACT

A magnetic memory device can include a plurality of separately controllable magnetic memory segments configured to store data. A plurality of separately controllable source lines can each be coupled to a respective one of the plurality of separately controllable magnetic memory segments.

18 Claims, 24 Drawing Sheets

(56) References Cited

U.S. PATENT DOCUMENTS

| | | | |
|---|---|---|---|
| 2009/0073756 A1* | 3/2009 | Yang | G11C 11/16 365/171 |
| 2010/0091550 A1* | 4/2010 | Chen | G11C 11/16 365/148 |
| 2010/0118581 A1* | 5/2010 | Okayama | G11C 11/16 365/51 |
| 2010/0277972 A1* | 11/2010 | Ueda | G11C 11/16 365/158 |
| 2011/0216580 A1 | 9/2011 | Berger et al. | |
| 2011/0235402 A1* | 9/2011 | Ueda | G11C 7/14 365/148 |
| 2012/0257444 A1 | 10/2012 | Oh | |
| 2013/0155761 A1* | 6/2013 | Aoki | G11C 11/161 365/158 |
| 2013/0301335 A1* | 11/2013 | Ong | G11C 29/06 365/148 |
| 2014/0126265 A1 | 5/2014 | Lee et al. | |
| 2014/0301128 A1* | 10/2014 | Park | G11C 11/161 365/148 |

* cited by examiner

| | | WL | | BL | | SL |
|---|---|---|---|---|---|---|
| | | SEL | UNSEL | SEL | UNSEL | |
| Normal SEG | Data '0' | Von | Voff | $V_{BL1}$ | $V_{S1}$ | $V_{S1}$ |
| | Data '1' | Von | Voff | $V_{BL2}$ | $V_{S1}$ | |
| Fail SEG | | Voff | | $V_{BL2}/VB_{BL2}/V_{S1}$ | | $V_{S2}$ |

SEMICONDUCTOR RESISTIVE MEMORY DEVICES INCLUDING SEPARATELY CONTROLLABLE SOURCE LINES

CROSS-REFERENCE TO RELATED APPLICATIONS

This U.S. non-provisional patent application claims priority under 35 U.S.C. §119 to Korean Patent Application No. 10-2014-0044336, filed on Apr. 14, 2014, in the Korean Intellectual Property Office, the disclosure of which is hereby incorporated by reference.

BACKGROUND

The inventive concepts relate to semiconductor memory devices, and in particular, to semiconductor memory devices with variable resistance memory cells.

Some semiconductor devices include memory devices used to store data, logic devices used to process data, and systems-on-chip that may be configured to operate memory devices and logic devices.

As the electronics industry advances, technical difficulties, such as decreased process margins and increased resistance of memory cells arise.

SUMMARY

Embodiments according to the present invention can provide semiconductor resistive memory devices including separately controllable source lines. Pursuant to these embodiments, a magnetic memory device can include a plurality of separately controllable magnetic memory segments configured to store data. A plurality of separately controllable source lines can each be coupled to a respective one of the plurality of separately controllable magnetic memory segments.

In some embodiments, the magnetic memory device can further include a plurality of separately controllable source line driver circuits, each being coupled to a respective one of the plurality of separately controllable source lines. In some embodiments, each of the plurality of separately controllable source line driver circuits is coupled to a respective one of a plurality of separately controllable repair enable signals.

In some embodiments, the magnetic memory device can further include a repair circuit configured to enable or disable each of the plurality of separately controllable repair enable signals separately from one another. In some embodiments, each of the plurality of separately controllable source line driver circuits is configured to drive a first source line voltage signal to the respective one of the plurality of separately controllable source lines responsive to the respective one of the plurality of separately controllable repair enable signals being disabled. Each of the plurality of separately controllable source line driver circuits is configured to drive a second source line voltage signal to the respective one of the plurality of separately controllable source lines responsive to the respective one of the plurality of separately controllable repair enable signals being enabled.

In some embodiments, the magnetic memory device can further include a respective plurality of word lines in each of the plurality of separately controllable magnetic memory segments and a respective plurality of magnetic memory cells can be in each of the plurality of separately controllable magnetic memory segments, where the respective plurality of word lines are coupled to the respective plurality of magnetic memory cells.

In some embodiments, a word line enable voltage level for the word lines is about equal to a repair enable voltage level for the separately controllable repair enable signals being enabled. In some embodiments, the magnetic memory device can further include a separately controllable redundancy magnetic memory segment configured to store the data addressed to a failed one of the plurality of separately controllable magnetic memory segments. A separately controllable redundancy source line can be coupled to the separately controllable redundancy magnetic memory segment.

In some embodiments, the magnetic memory device can further include a separately controllable redundancy source line driver circuit, coupled to the separately controllable redundancy source line. In some embodiments, the separately controllable redundancy source line driver circuit is configured to drive a first source line voltage to the separately controllable redundancy source line responsive to the separately controllable redundancy source line driver circuit being enabled by a first state of a repair enable signal. The separately controllable redundancy source line driver circuit can be configured to drive a second source line voltage to the separately controllable redundancy source line responsive to the separately controllable redundancy source line driver circuit being disabled by a second state of the repair enable signal.

BRIEF DESCRIPTION OF THE DRAWINGS

The embodiments will be more clearly understood from the following brief description taken in conjunction with the accompanying drawings. The accompanying drawings represent non-limiting, example embodiments as described herein.

DETAILED DESCRIPTION OF EMBODIMENTS ACCORDING TO THE INVENTIVE CONCEPT

Figure 1:
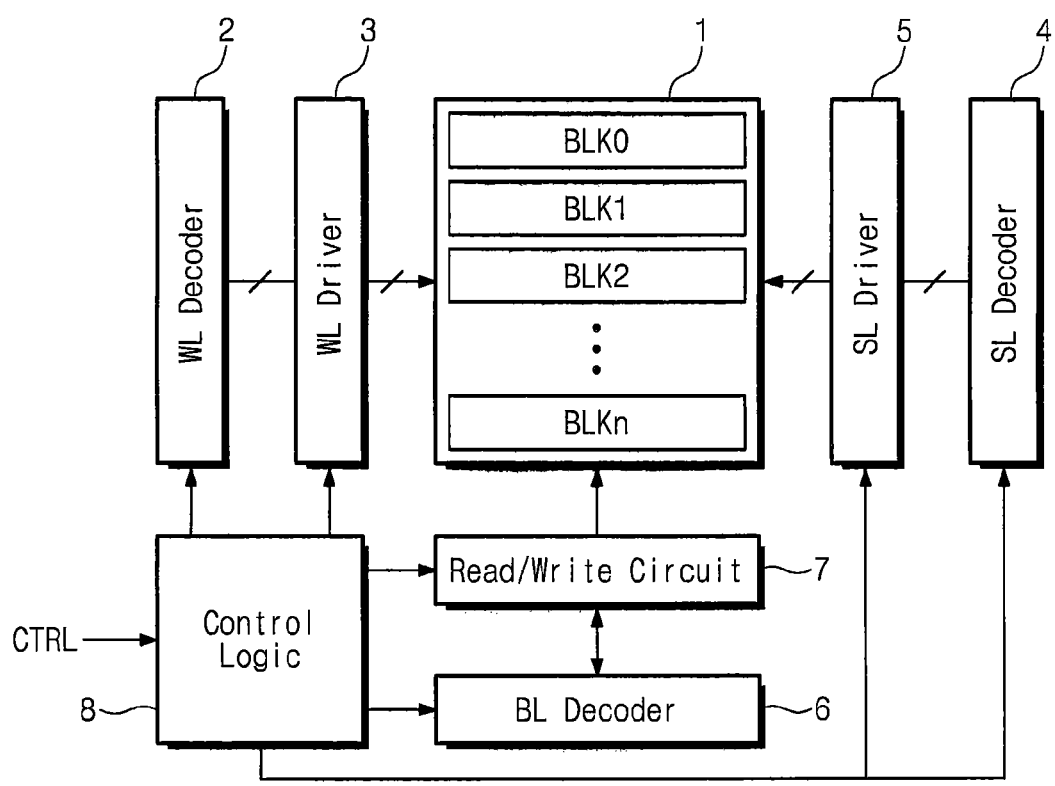
FIG. 1 is a block diagram schematically illustrating semiconductor memory devices according to some embodiments of the inventive concept.

Example embodiments of the inventive concepts will now be described more fully with reference to the accompanying drawings, in which example embodiments are shown. Example embodiments of the inventive concepts may, however, be embodied in many different forms and should not be construed as being limited to the embodiments set forth herein; rather, these embodiments are provided so that this disclosure will be thorough and complete, and will fully convey the concept of example embodiments to those of ordinary skill in the art. In the drawings, the thicknesses of layers and regions are exaggerated for clarity. Like reference numerals in the drawings denote like elements.

It will be understood that when an element is referred to as being "connected" or "coupled" to another element, it can be directly connected or coupled to the other element or intervening elements may be present. In contrast, when an element is referred to as being "directly connected" or "directly coupled" to another element, there are no intervening elements present. Like numbers indicate like elements throughout. As used herein the term "and/or" includes any and all combinations of one or more of the associated listed items. Other words used to describe the relationship between elements or layers should be interpreted in a like fashion (e.g., "between" versus "directly between," "adjacent" versus "directly adjacent," "on" versus "directly on").

It will be understood that, although the terms "first", "second", etc. may be used herein to describe various elements, components, regions, layers and/or sections, these elements, components, regions, layers and/or sections should not be limited by these terms. These terms are only used to distinguish one element, component, region, layer or section from another element, component, region, layer or section. Thus, a first element, component, region, layer or section discussed below could be termed a second element, component, region, layer or section without departing from the teachings of example embodiments.

Spatially relative terms, such as "beneath," "below," "lower," "above," "upper" and the like, may be used herein for ease of description to describe one element or feature's relationship to another element(s) or feature(s) as illustrated in the figures. It will be understood that the spatially relative terms are intended to encompass different orientations of the device in use or operation in addition to the orientation depicted in the figures. For example, if the device in the figures is turned over, elements described as "below" or "beneath" other elements or features would then be oriented "above" the other elements or features. Thus, the exemplary term "below" can encompass both an orientation of above and below. The device may be otherwise oriented (rotated 90 degrees or at other orientations) and the spatially relative descriptors used herein interpreted accordingly.

The terminology used herein is for the purpose of describing particular embodiments only and is not intended to be limiting of example embodiments. As used herein, the singular forms "a," "an" and "the" are intended to include the plural forms as well, unless the context clearly indicates otherwise. It will be further understood that the terms "comprises", "comprising", "includes" and/or "including," if used herein, specify the presence of stated features, integers, steps, operations, elements and/or components, but do not preclude the presence or addition of one or more other features, integers, steps, operations, elements, components and/or groups thereof.

Example embodiments of the inventive concepts are described herein with reference to cross-sectional illustrations that are schematic illustrations of idealized embodiments (and intermediate structures) of example embodiments. As such, variations from the shapes of the illustrations as a result, for example, of manufacturing techniques and/or tolerances, are to be expected. Thus, example embodiments of the inventive concepts should not be construed as limited to the particular shapes of regions illustrated herein but are to include deviations in shapes that result, for example, from manufacturing. For example, an implanted region illustrated as a rectangle may have rounded or curved features and/or a gradient of implant concentration at its edges rather than a binary change from implanted to non-implanted region. Likewise, a buried region formed by implantation may result in some implantation in the region between the buried region and the surface through which the implantation takes place. Thus, the regions illustrated in the figures are schematic in nature and their shapes are not intended to illustrate the actual shape of a region of a device and are not intended to limit the scope of example embodiments.

As appreciated by the present inventive entity, devices and methods of forming devices according to various embodiments described herein may be embodied in microelectronic devices such as integrated circuits, wherein a plurality of devices according to various embodiments described herein are integrated in the same microelectronic device. Accordingly, the cross-sectional view(s) illustrated herein may be replicated in two different directions, which need not be orthogonal, in the microelectronic device. Thus, a plan view of the microelectronic device that embodies devices according to various embodiments described herein may include a plurality of the devices in an array and/or in a two-dimensional pattern that is based on the functionality of the microelectronic device.

The devices according to various embodiments described herein may be interspersed among other devices depending on the functionality of the microelectronic device. Moreover, microelectronic devices according to various embodiments described herein may be replicated in a third direction that may be orthogonal to the two different directions, to provide three-dimensional integrated circuits.

Accordingly, the cross-sectional view(s) illustrated herein provide support for a plurality of devices according to various embodiments described herein that extend along two different directions in a plan view and/or in three different directions in a perspective view. For example, when a single active region is illustrated in a cross-sectional view of a device/structure, the device/structure may include a plurality of active regions and transistor structures (or memory cell structures, gate structures, etc., as appropriate to the case) thereon, as would be illustrated by a plan view of the device/structure.

Unless otherwise defined, all terms (including technical and scientific terms) used herein have the same meaning as commonly understood by one of ordinary skill in the art to which example embodiments of the inventive concepts belong. It will be further understood that terms, such as those defined in commonly-used dictionaries, should be interpreted as having a meaning that is consistent with their meaning in the context of the relevant art and will not be interpreted in an idealized or overly formal sense unless expressly so defined herein.

FIG. 1 is a block diagram schematically illustrating semiconductor memory devices according to some embodiments of the inventive concept.

Referring to FIG. 1, a semiconductor memory device may include a memory cell array 1, a word line decoder 2, a word line driver 3, a source line decoder 4, a source line driver 5, a bit line decoder 6, a read and write circuit 7, and a control logic 8.

The memory cell array 1 may include a plurality of memory blocks BLK0-BLKn, and each of the memory blocks BLK0-BLKn may include a plurality of memory cells, a plurality of word lines, a plurality of bit lines, and a plurality of source lines. The word, bit, and source lines may be electrically connected to the memory cells.

The word line decoder 2 may decode address information input from the outside and then select one of the word lines based on the decoded address information. The address information decoded by the word line decoder 2 may be transmitted to the word line driver 3. The word line driver 3 may provide word line voltages, which are generated by a voltage generating circuit, to selected and unselected ones of the word lines, in response to control signals from the control logic 8. The word line decoder 2 and the word line driver 3 may be connected in common to the plurality of memory blocks BLK0-BLKn and may provide a word line driving signal to the word lines of a selected one of the memory blocks BLK0-BLKn, in response to a block selection signal.

The source line decoder 4 may decode address information input from the outside and then select one of the source lines. The address information decoded by the source line decoder 4 may be transmitted to the source line driver 5. The source line driver 5 may provide source line voltages, which are generated by the voltage generating circuit, to selected and unselected ones of the source lines, in response to control signals from the control logic 8. The source line decoder 4 and the source line driver 5 may be connected in common to the plurality of memory blocks BLK0-BLKn and may provide a source line driving signal to the source lines of the selected one of the memory blocks BLK0-BLKn, in response to the block selection signal.

The bit line decoder 6 may decode address information input from the outside and then select one of the bit lines. The bit line decoder 6 may be connected in common to the plurality of memory blocks BLK0-BLKn and may provide data signals to the bit lines of the selected one of the memory blocks BLK0-BLKn, in response to a block selection signal.

The read and write circuit 7 may be connected to the memory cell array 1 through the bit lines. The read and write circuit 7 may be configured to select at least one of the bit lines, in response to a bit line selection signal from the bit line decoder 6. The read and write circuit 7 may be configured to exchange data with an external device. The read and write circuit 7 operates in response to control signals from the control logic 8. The read and write circuit 7 may be configured to transmit power (e.g., voltage and/or current) from the control logic 8 to the selected at least one of the bit lines.

The control logic 8 may be configured to control overall operations of the semiconductor memory device. For example, the control logic 8 may receive a control signal CTRL and an external voltage and perform a corresponding operation based on the received control signal. In some embodiments, the control logic 8 may be configured to produce electric power used to perform internal operations, using an external voltage. The control logic 8 may be configured to control read, write, and/or erase operations in response to the control signals.

Figure 2:
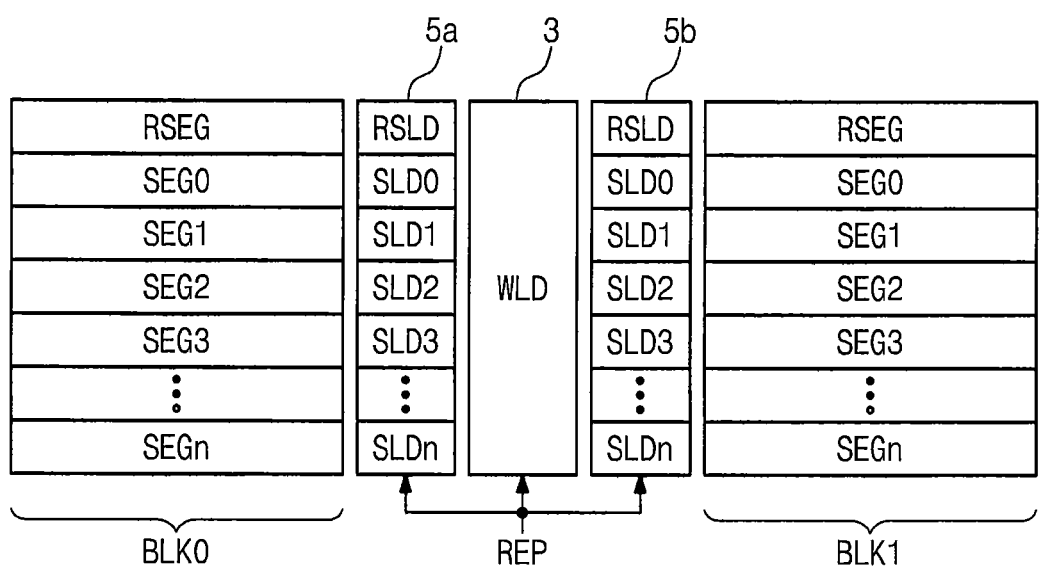
FIG. 2 is a block diagram illustrating a portion of semiconductor memory devices according to some embodiments of the inventive concept.

FIG. 2 is a block diagram illustrating a portion of semiconductor memory devices according to some embodiments of the inventive concept.

Referring to FIG. 2, a semiconductor memory device may include first and second memory blocks BLK0 and BLK1, first and second source line driver blocks 5a and 5b, and the word line driver 3.

Each of the first and second memory blocks BLK0 and BLK1 may include a plurality of memory segments SEG0-SEGn and a redundancy segment RSEG. Each of the plurality of memory segments SEG0-SEGn and the redundancy segment RSEG may include a plurality of memory cells, a plurality of word lines, a plurality of bit lines, and a plurality of source lines. The word, bit, and source lines may be electrically connected to the memory cells.

The first source line driver block 5a may be connected to the first memory block BLK0, and the second source line driver block 5b may be connected to the second memory block BLK1. Each of the first and second source line driver blocks 5a and 5b may include a plurality of source line drivers SLD0-SLDn and at least one redundancy source line driver RSLD. The source line drivers SLD0-SLDn may be connected to the memory segments SEG0-SEGn, respectively, and the redundancy source line driver RSLD may be connected to the redundancy segment RSEG. In some embodiments, each of the first and second source line driver blocks 5a and 5b may be controlled by a repair signal REP from the repair circuit. Each of the source line drivers SLD0-SLDn and the redundancy source line driver RSLD may be configured to provide source line voltages, which are generated by the voltage generating circuit, to selected and unselected source lines, in response to the repair signal REP.

The word line driver 3 may be connected to the first and second memory blocks BLK0 and BLK1. The word line driver 3 may provide the word line voltages, which are generated by the voltage generating circuit, to selected and unselected ones of the word lines of the memory segments SEG0-SEGn, in response to control signals from the control logic 8. Further, the word line driver 3 may be configured to transmit the word line voltages, which are generated by the voltage generating circuit, to selected and unselected word lines of the redundancy segment RSEG, in response to the repair signal REP from the repair circuit.

Figure 3:
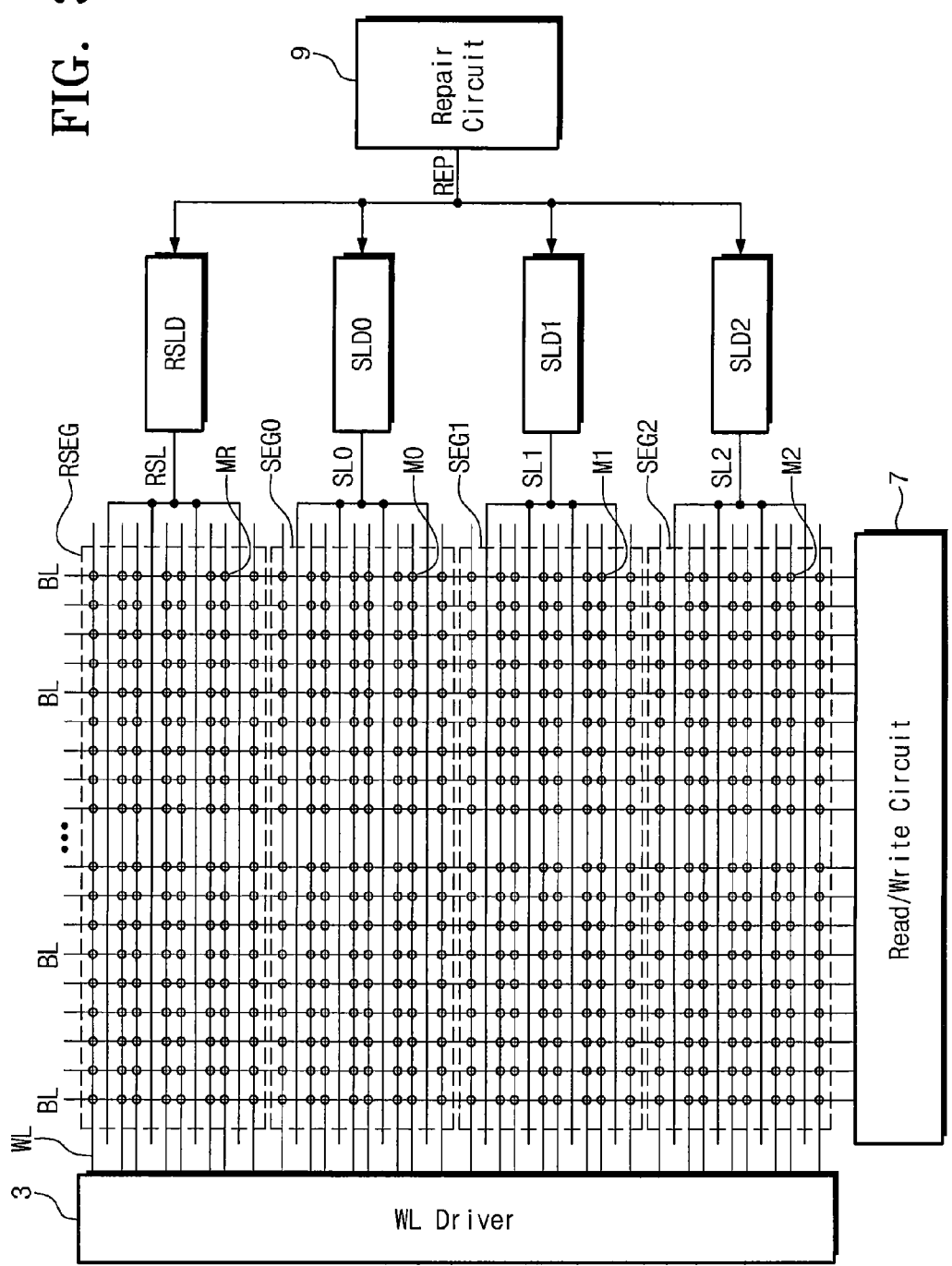
FIG. 3 is a schematic circuit diagram illustrating a portion of semiconductor memory devices according to some embodiments of the inventive concept.

FIG. 3 is a schematic circuit diagram illustrating a portion of semiconductor memory devices according to some embodiments of the inventive concept.

Referring to FIG. 3, in a semiconductor memory device, each of the memory blocks may include first to third memory segments SEG0, SEG1, and SEG2 and the redundancy segment RSEG. Each of the first to third memory segments SEG0, SEG1, and SEG2 and the redundancy segment RSEG may include a plurality of word lines WL, a plurality of bit lines BL, and a plurality of memory cells, which are respectively provided at intersections of the word lines WL and the bit lines BL. The word lines WL may be connected to the word line driver 3 of FIG. 1, and the bit lines BL may be connected to the read and write circuit 7 of FIG. 1. Although three memory segments are illustrated in FIG. 3, the number of the memory segments may vary, as described above.

In some embodiments, the redundancy segment RSEG may include a plurality of redundancy memory cells MR, which are respectively provided at intersections of the word lines WL and the bit lines BL, and the redundancy memory cells MR may be connected in common to a redundancy source line RSL. The first memory segment SEG0 may include first memory cells M0, which are respectively provided at intersections of the word lines WL and the bit lines BL, and the first memory cells M0 may be connected in common to a first source line SL0. The second memory segment SEG1 may include second memory cells M1, which are respectively provided at intersections of the word lines WL and the bit lines BL, and the second memory cells M1 may be connected in common to a second source line SL1. The third memory segment SEG2 may include third memory cells M2, which are respectively provided at intersections of the word lines WL and the bit lines BL, and the third memory cells M2 may be connected in common to a third source line SL2.

In some embodiments, the redundancy memory cells MR and the first to third memory cells M0-M2 may have the same characteristics and the same structure as each other, the configuration of the memory cells will be described in more detail with reference to FIG. 4.

In some embodiments, the redundancy source line RSL may be connected to the redundancy source line driver RSLD. The first source line SL0 may be connected to the first source line driver SLD0. The second source line SL1 may be connected to the second source line driver SLD1. The third source line SL2 may be connected to the third source line driver SLD2. The first to third source line drivers SLD0, SLD1, and SLD2 and the redundancy source line driver RSLD may be controlled by a repair circuit 9 of FIG. 1. For example, the repair circuit 9 of FIG. 1 may be configured to generate the repair signal REP for controlling source line voltages to be applied to the redundancy source line RSL and the source lines SL0, SL1, and SL2, respectively.

In some embodiments, at least one of the first to third memory segments SEG0, SEG1, and SEG2 may be a failed memory segment including at least one failed memory cell, and the failed memory segment may be repaired by the redundancy segment RSEG. For example, the repair circuit 9 of FIG. 3 may enable the repair signal REP to the source line driver that is connected to the failed memory segment.

Further, the repair circuit 9 of FIG. 3 may disable the repair signal REP to the source line drivers that are connected to normal memory segments with normal memory cells (i.e., not failed). A source line voltage may be applied in connection to the source lines of the normal memory segments.

Figure 4A:
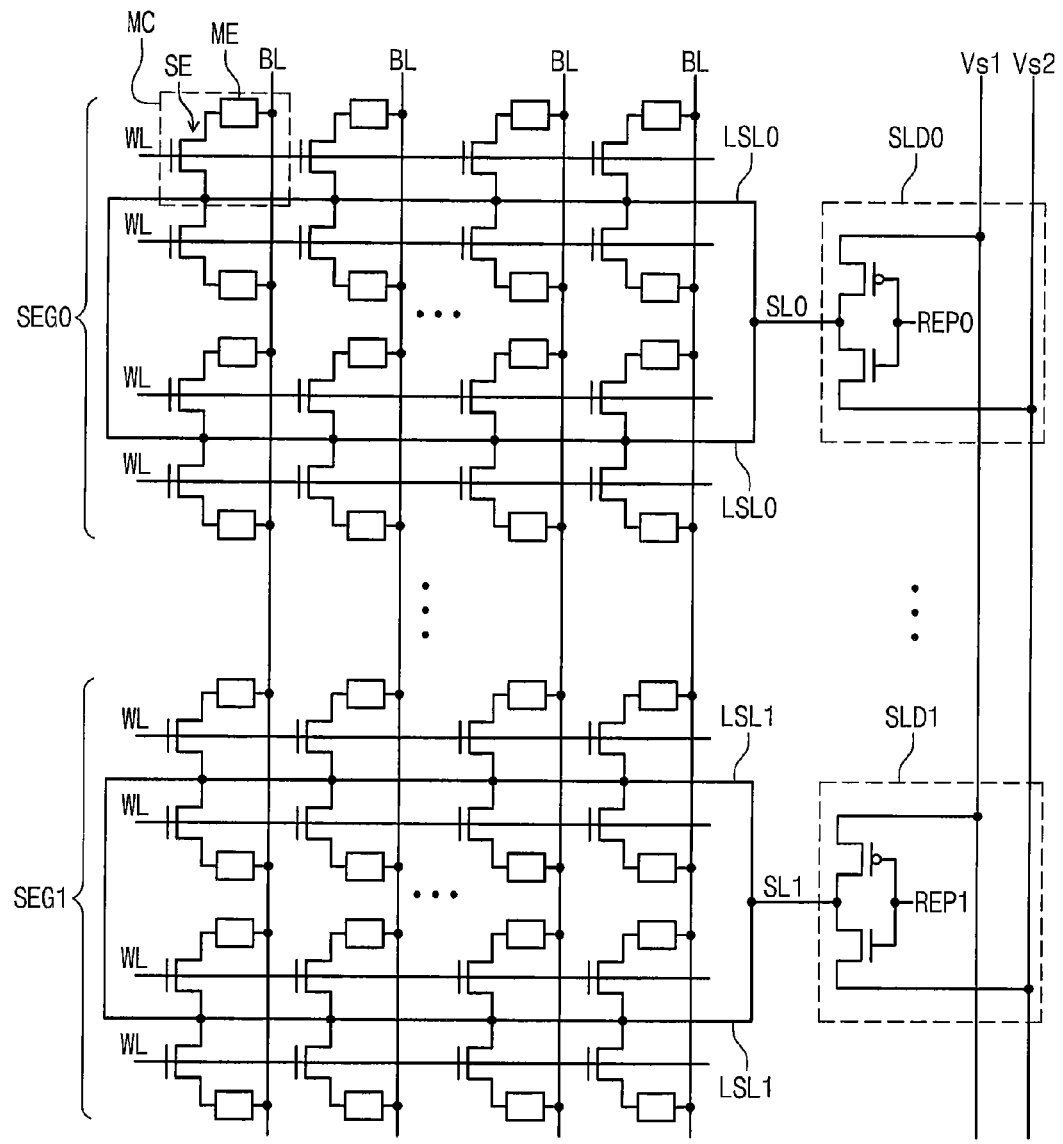
FIG. 4A and FIG. 4B are circuit diagrams illustrating a portion of semiconductor memory devices according to some embodiments of the inventive concept.
Figure 4B:
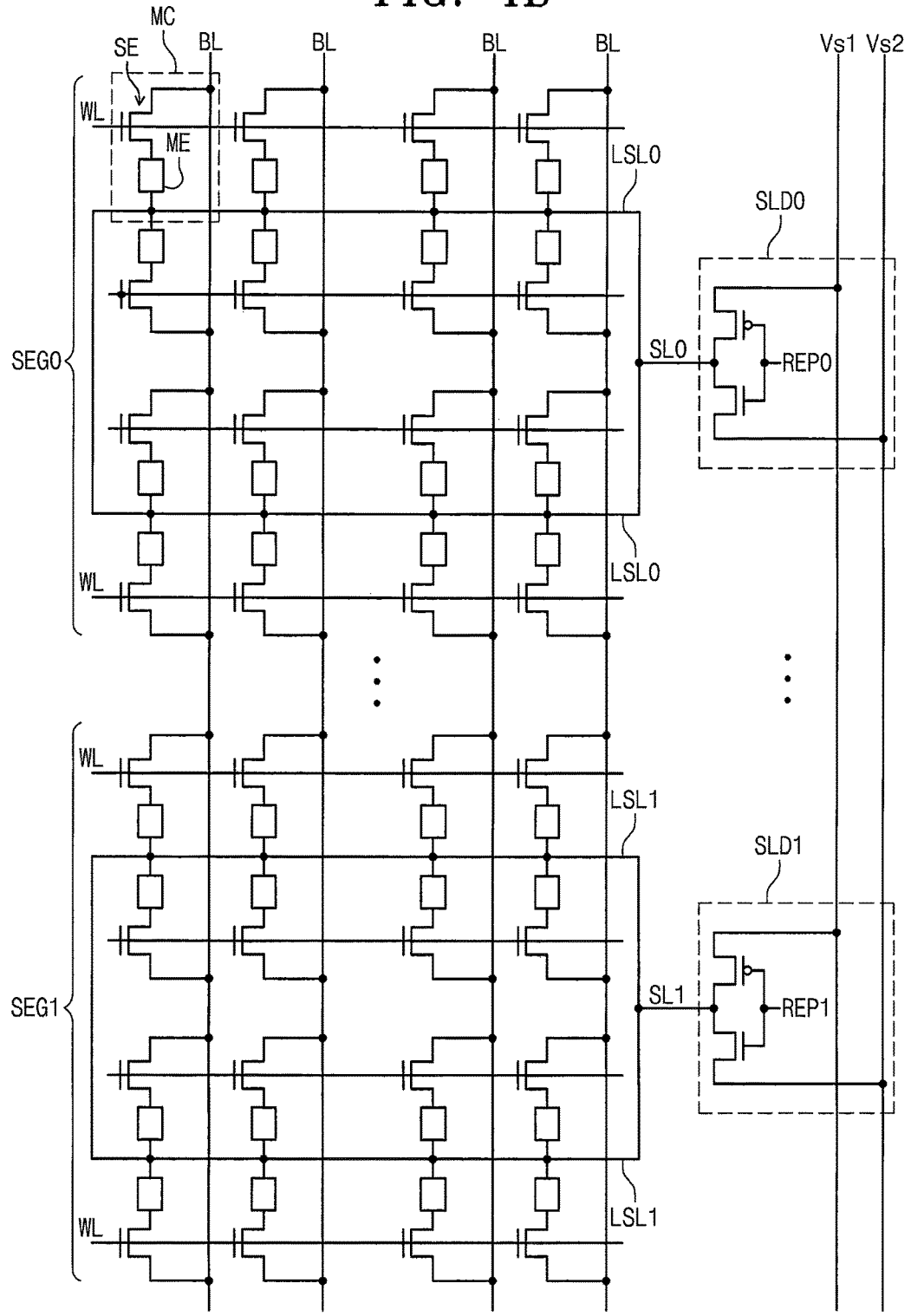

FIGS. 4A and 4B are circuit diagrams illustrating a portion of semiconductor memory devices according to some embodiments of the inventive concept.

Referring to FIGS. 4A and 4B, each of the first and second memory segments SEG1 and SEG2 may include a plurality of word lines WL, a plurality of bit lines BL, a plurality of local source lines LSL0 or LSL1, and a plurality of unit memory cells MC. Although two memory segments are illustrated in FIGS. 4A and 4B, any number of memory segments may be used, as described above.

In the first memory segment SEG0, the first local source lines LSL0 may be disposed between the word lines WL that are adjacent to each other and may be connected in common to the first source line SL0. In other words, in some embodiments, both of the first local source lines used are coupled to the first source line SL0. Here, the first source line SL0 may be connected to the first source line driver SLD0. For example, the plurality of memory cells MC, which are orthogonally arranged in the first memory segment SEG0, may be connected in common to the first source line SL0.

In the second memory segment SEG1, the second local source lines LSL1 may be disposed between the word lines WL that are adjacent to each other and may be connected in common to the second source line SL1. Here, the second source line SL1 may be connected to the second source line driver SLD1. For example, the plurality of memory cells MC, which are orthogonally arranged in the second memory segment SEG1, may be connected in common to the second source line SL1.

In some embodiments, the unit memory cells MC may be provided between the word and bit lines WL and BL crossing each other. Each of the unit memory cells MC may include a memory element ME and a selection element SE.

In some embodiments, as shown in FIG. 4A, the memory element ME may be disposed between the bit line BL and the selection element SE. The selection element SE may be disposed between the memory element ME and the local source line LSL0 or LSL1 and may be controlled by the word line WL. The local source line LSL0 or LSL1 may be provided between adjacent ones of the word lines WL and may be shared by pairs of the selection elements SE provided adjacent thereto. In some embodiments, as shown in FIG. 4B, the memory element ME may be disposed between the local source line LSL0 or LSL1 and the selection element SE, and adjacent ones of the memory element MEs may share the local source line LSL0 or LSL1. The selection element SE may be disposed between the memory element ME and the bit line BL and may be controlled by the word line WL.

The memory element ME may be a variable resistance device, whose electrical resistance can be set to one of two different values using an electric pulse applied thereto. In some embodiments, the memory element ME may be formed to have a multi-layered structure, the electrical resistance of which can be changed using spin torque transfer phenomena of electrons passing therethrough. As an example, the memory element ME may include a multi-layered structure that is configured to exhibit a magneto-resistance property and includes at least one ferromagnetic layer and/or at least one antiferromagnetic layer. In some embodiments, the memory element ME may include a phase-changeable material, whose crystal structure or phase can be changed depending on an amount of current passing therethrough. For example, the phase-changeable material may include at least one of two-element compounds (e.g., GaSb, InSb, InSe, $Sb_2Te_3$, and GeTe), three-element compounds (e.g., GeSbTe, GaSeTe, InSbTe, $SnSb_2Te_4$, and InSbGe), and four-element compounds (e.g., AgInSbTe, (GeSn)SbTe, GeSb(SeTe), and $Te_{81}Ge_{15}Sb_2S_2$). By controlling heating temperature and quenching speed of the phase-changeable material, electrical resistance or phase of the phase change material may be changed into one of a high (amorphous state) and a low (crystalline state). Here, the heating temperature and quenching speed of the phase-changeable material can be controlled by adjusting an amount or density of current supplied thereto (i.e., by adjusting Joule's heat generated at the phase-changeable material). In some embodiments, the memory element ME may be realized using at least one of Perovskite compounds or transition metal oxides.

The selection element SE may be configured to control a flow of current to the memory element ME, in response to a voltage applied to the word line WL. For example, the selection element SE may be provided in the form of an MOSFET.

In some embodiments, each of the first and second source line drivers SLD0 and SLD1 may include an inverter circuit and may be configured to transmit a first or second source line voltage $V_{S1}$ or $V_{S2}$ to a corresponding one of the first and second source lines SL0 and SL1, in response to the repair signals REP0 and REP1.

For example, each of the first and second source line drivers SLD0 and SLD1 may be configured to transmit the first source line voltage $V_{S1}$ to a corresponding one of the first and second source lines SL0 and SL1 when the repair signals REP0 and REP1 are disabled, and to transmit the second source line voltage $V_{S2}$ to a corresponding one of the first and second source lines SL0 and SL1, when the repair signals REP0 and REP1 are enabled.

In the case where the first and second source line drivers SLD0 and SLD1 are connected to normal memory segments, the repair signals REP0 and REP1 transmitted to the first and second source line drivers SLD0 and SLD1 are disabled to provide the first source line voltage $V_{S1}$ to both the first and second source lines SL0 and SL1. Alternatively, in the case where the first memory segment SEG0 includes a failed memory cell, the repair signal REP0 transmitted to the first source line driver SLD0 is enabled to provide the second source line voltage $V_{S2}$ to the first source line SL0.

Hereinafter, a method of operating a semiconductor memory device, according to example embodiments of the inventive concept, will be described with reference to FIGS. 5A, 5B, 6, and 7.

Figure 5A:
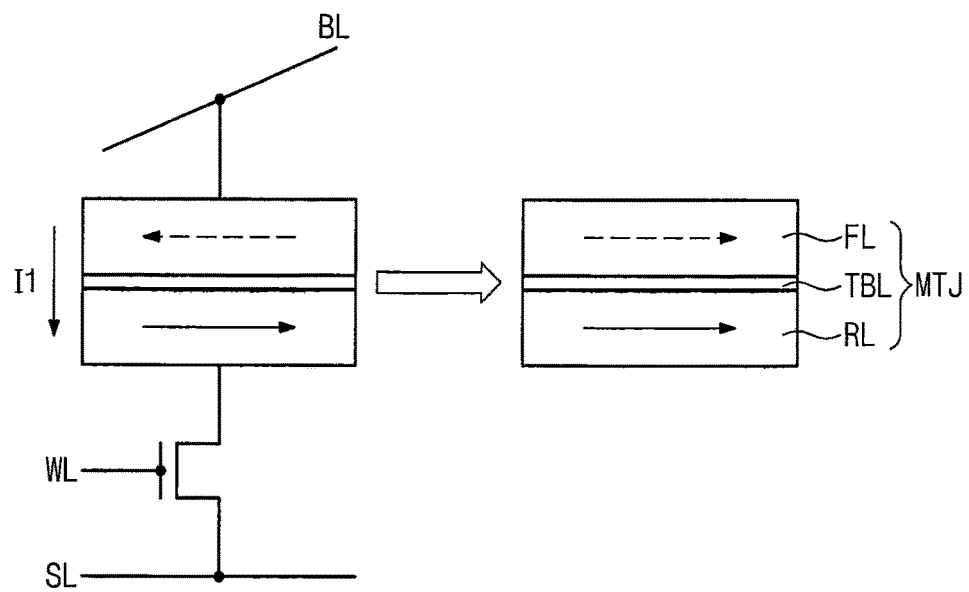
FIGS. 5A and 5B are diagrams illustrating write operations of semiconductor memory devices according to some embodiments of the inventive concept.
Figure 5B:
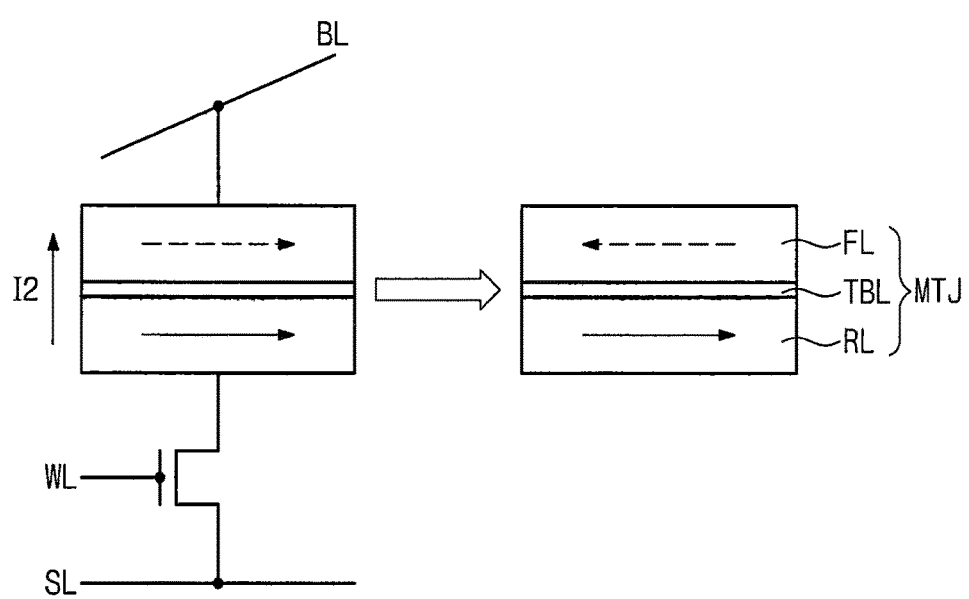

FIGS. 5A and 5B are diagrams illustrating write operations of semiconductor memory devices according to some embodiments of the inventive concept.

Referring to FIGS. 5A and 5B, each unit memory cell may include a magnetic tunnel junction MTJ serving as the memory element ME and an MOS transistor serving as the selection element SE. Gate and source electrodes of the MOS transistor may be connected to the word and source lines WL and SL, respectively, and a drain electrode of the MOS transistor may be connected to the bit line BL through the magnetic tunnel junction MTJ. In operation of the unit memory cell, a turn-on voltage is applied to the word line WL to control a flow of first or second write current I1 or I2 between the bit line BL and the source line SL.

The magnetic tunnel junction MTJ may include a reference magnetic layer RL, a free magnetic layer FL, and a tunnel barrier layer TBL therebetween. The reference magnetic layer RL may be configured to have a fixed magnetization direction, and the free magnetic layer FL may be configured to have a switchable magnetization direction (for example, parallel or antiparallel to that of the reference magnetic layer RL). When the magnetization directions of the reference and free magnetic layers RL and FL are parallel to each other, the magnetic tunnel junction MTJ may have a low resistance or a state of data '0'. By contrast, when the magnetization directions of the reference and free magnetic layers RL and FL are anti-parallel to each other, the magnetic tunnel junction MTJ may have a high resistance or a state of data '1'.

FIG. 5A shows a write operation for changing data stored in the magnetic tunnel junction MTJ from the state of high resistance or data '1' to the state of low resistance or data '0'. A step of writing the data '0' in the magnetic tunnel junction MTJ may include flowing the first write current I1 from the selected bit line BL to the source line SL via the magnetic tunnel junction MTJ, and in this case, the magnetization direction of the free magnetic layer FL may be switched in such a way that the magnetization directions of the reference and free magnetic layers RL and FL become parallel to each other.

FIG. 5B shows a write operation for changing data stored in the magnetic tunnel junction MTJ from the state of low resistance or data '0' to the state of high resistance or data '1'. A step of writing the data '1' in the magnetic tunnel junction MTJ may include flowing the second write current I2 from the source line SL to the selected bit line BL via the magnetic tunnel junction MTJ, and in this case, the magnetization direction of the free magnetic layer FL may be switched in such a way that the magnetization directions of the reference and free magnetic layers RL and FL become anti-parallel to each other.

Figures 6, 7:
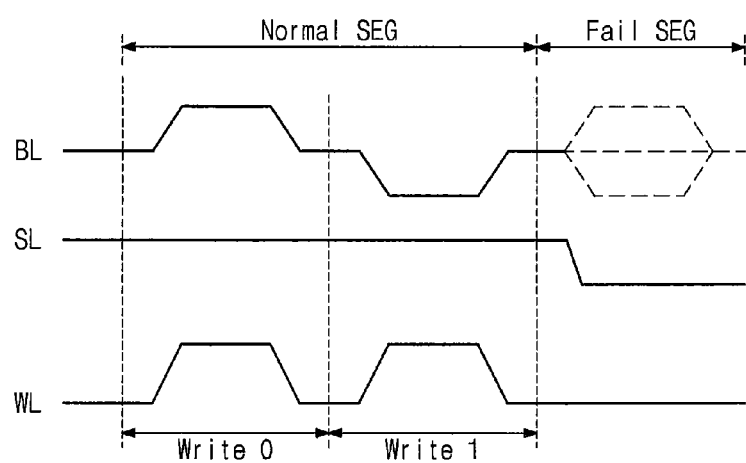
FIG. 6 is a table showing voltages used in operations of semiconductor memory devices, according to some embodiments of the inventive concept.
FIG. 7 is a timing diagram illustrating operations of semiconductor memory devices, according to some embodiments of the inventive concept.

FIG. 6 is a table showing voltages used in operations of semiconductor memory devices, according to some embodiments of the inventive concept. FIG. 7 is a timing diagram illustrating operations of semiconductor memory devices, according to some embodiments of the inventive concept.

Referring to FIGS. 6 and 7, the data '0' or '1' may be written in one (hereinafter, 'selected memory cell'), which is selected from memory cells of normal memory segments Normal SEG having a disabled repair signal applied.

To write the data '0' in the selected memory cell, a turn-on voltage Von may be applied to a selected word line SEL WL that is connected to the selected memory cell, and a turn-off voltage Voff may be applied to unselected word lines UNSEL WL that are not connected to the selected memory cell. Further, a first bit line voltage $V_{BL1}$ may be applied to a selected bit line SEL BL that is connected to the selected memory cell, and the first source line voltage $V_{S1}$ may be applied to unselected bit lines UNSEL BL that are not connected to the selected memory cell. Here, the first bit line voltage $V_{BL1}$ may be greater than the first source line voltage $V_{S1}$, and the first source line voltage $V_{S1}$ may be applied in common to the source lines SL of the normal memory segment Normal SEG.

Under the above voltage conditions, since there is a difference in voltage between the selected bit line SEL BL and the source line SL, the first write current I1 may flow from the selected bit line SEL BL to the source line SL through the magnetic tunnel junction MTJ, as described with reference to FIG. 5A. By contrast, such a current flow may not be formed between the unselected bit line UNSEL BL and the source lines SL, because there is no difference in the voltage therebetween.

To write the data '1' in the selected memory cell, the selected word line SEL WL may be applied with the turn-on voltage Von, and the unselected word lines UNSEL WL may be provided with the turn-off voltage Voff. Further, the selected bit line SEL BL may be provided with a second bit line voltage $V_{BL2}$, and the unselected bit lines UNSEL BL may be applied with the first source line voltage $V_{S1}$. Here, the second bit line voltage $V_{BL2}$ may be less than the first source line voltage $V_{S1}$, and the first source line voltage $V_{S1}$ may be applied in common to the source lines SL of the normal memory segment Normal SEG.

Under the above voltage conditions, since there is a difference in the voltage between the selected bit line SEL BL and the source line SL, the second write current 12 may flow from the source line SL to the selected bit line SEL BL through the magnetic tunnel junction MTJ, as described with reference to FIG. 5B. By contrast, such a current flow may not be formed between the unselected bit line UNSEL BL and the source lines SL, because there is no difference in the voltage therebetween.

According to some embodiments of the inventive concept, the turn-off voltage Voff may be applied to the word lines WL of a failed memory segment Fail SEG, to which the enabled repair signal is applied. Further, the second source line voltage $V_{S2}$ may be applied to the source lines SL connected to the failed memory segment Fail SEG. Here, the second source line voltage $V_{S2}$ may be less than the first source line voltage $V_{S1}$ and the first and second bit line voltages $V_{BL1}$ and $V_{BL2}$. For example, the second source line voltage $V_{S2}$ may be the same as the turn-off voltage Voff.

In sum, during the operation of the semiconductor memory device, the source lines of the normal memory segments Normal SEG may be electrically connected to each other, and the source lines of the failed memory segment Fail SEG may be electrically separated from those of the normal memory segment Normal SEG.

Figure 8:
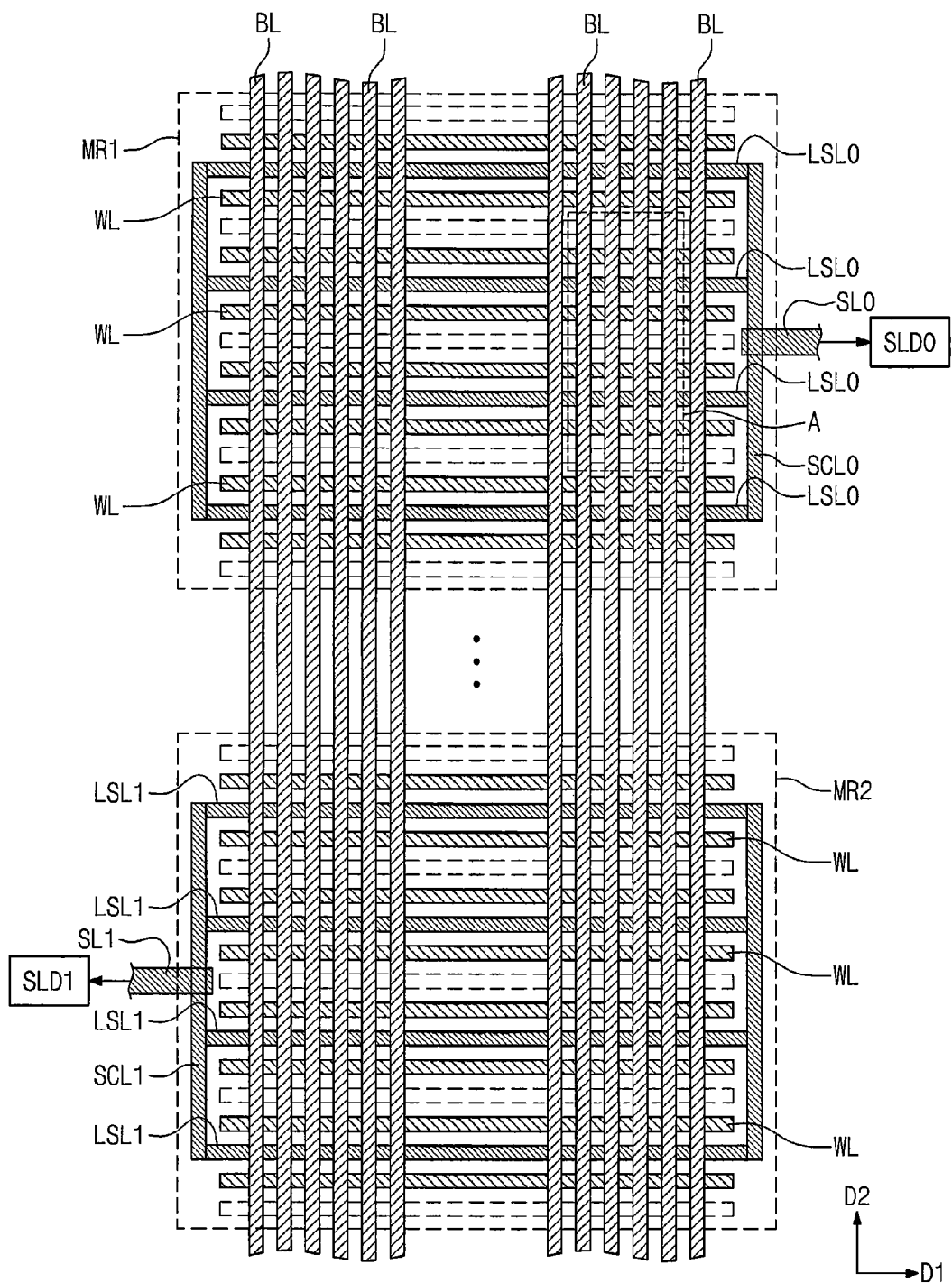
FIG. 8 is a schematic plan view illustrating semiconductor memory devices according to some embodiments of the inventive concept.

FIG. 8 is a schematic plan view illustrating semiconductor memory devices according to some embodiments of the inventive concept.

Referring to FIG. 8, a semiconductor memory device may include a plurality of memory regions. In some embodiments, the semiconductor memory device may include a first memory region MR1 and a second memory region MR2. A plurality of word lines WL extending parallel to the first direction D1 may be provided in each of the first and second memory regions MR1 and MR2. A plurality of bit lines BL extending parallel to the second direction D2 may be provided to cross the first and second memory regions MR1 and MR2 or the word lines WL thereof.

In the first memory region MR1, each of the first local source lines LSL0 may be disposed between a respective pair of the directly adjacent word lines WL and the first local source lines may all be connected to a first source connection line SCL0 at an edge region of the first memory region MR1. The first source connection line SCL0 may extend parallel to the second direction D2 and may be connected to the first source line driver SLD0 via the first source line SL0. In the second memory region MR2, each of the second local source lines LSL1 may be disposed between a respective pair of the directly adjacent word lines WL and the second local source lines LSL1 may all be connected to a second source connection line SCL1 at an edge region of the second memory region MR2. The second source connection line SCL1 may extend parallel to the second direction D2 and may be connected to the second source line driver SLD1 via the second source line SL1. In some embodiments, each of the first and second memory regions MR1 and MR2 may have first and second sides that are opposite to each other. In this case, the first source line SL0 may be coupled to the first source connection line SCL0 at the first side of the first memory region MR1, and the second source line SL1 may be coupled to the second source connection line SCL1 at the second side of the second memory region MR2. In some embodiments, the first and second source connection lines SCL0 and SCL1 may be disposed spaced apart from each other in the second direction D2, and a length of each of them may be shorter than that of each bit line BL.

Figure 9:
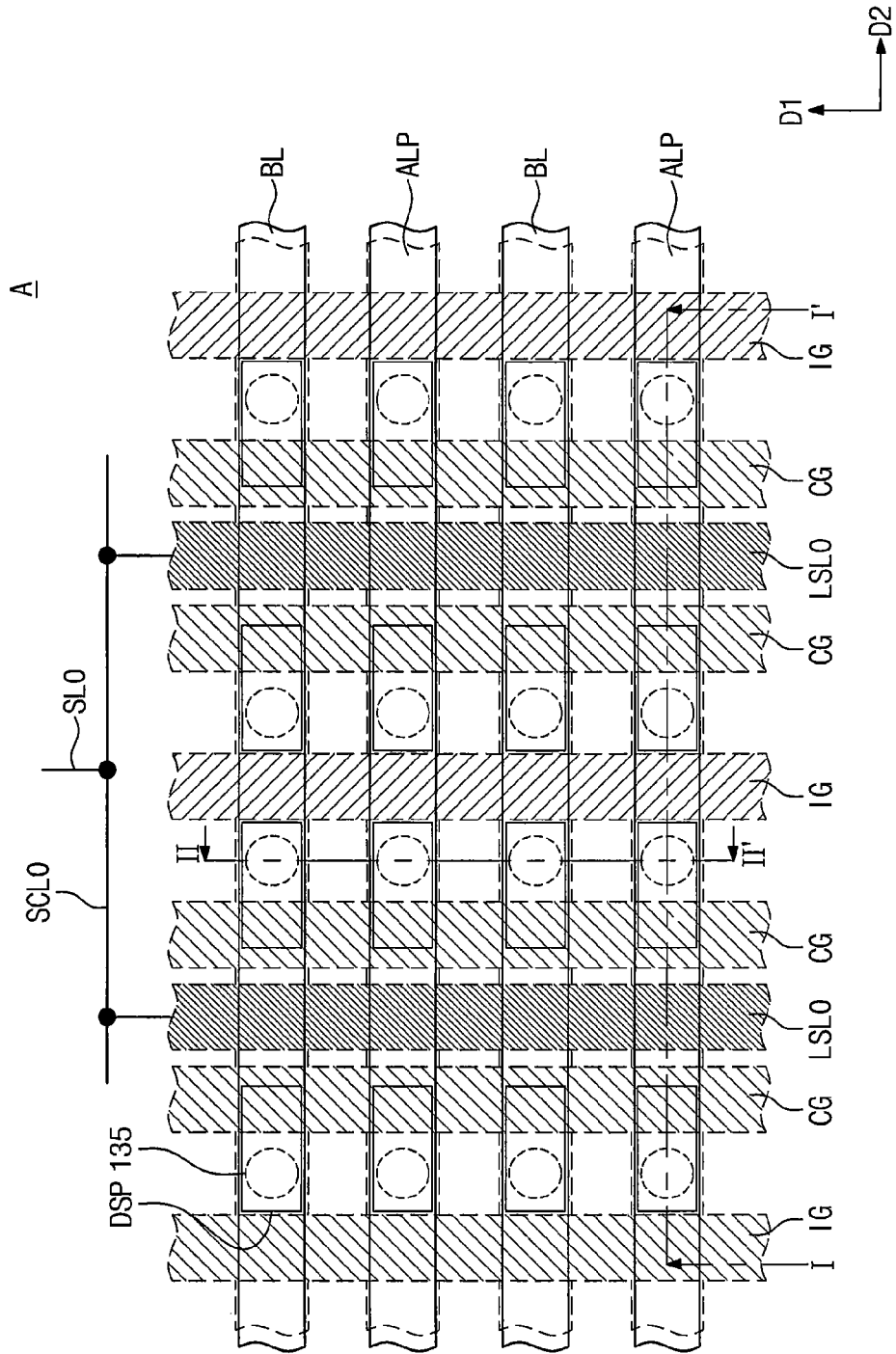
FIG. 9 is an enlarged plan view of a portion A of FIG. 8.
Figure 10A:
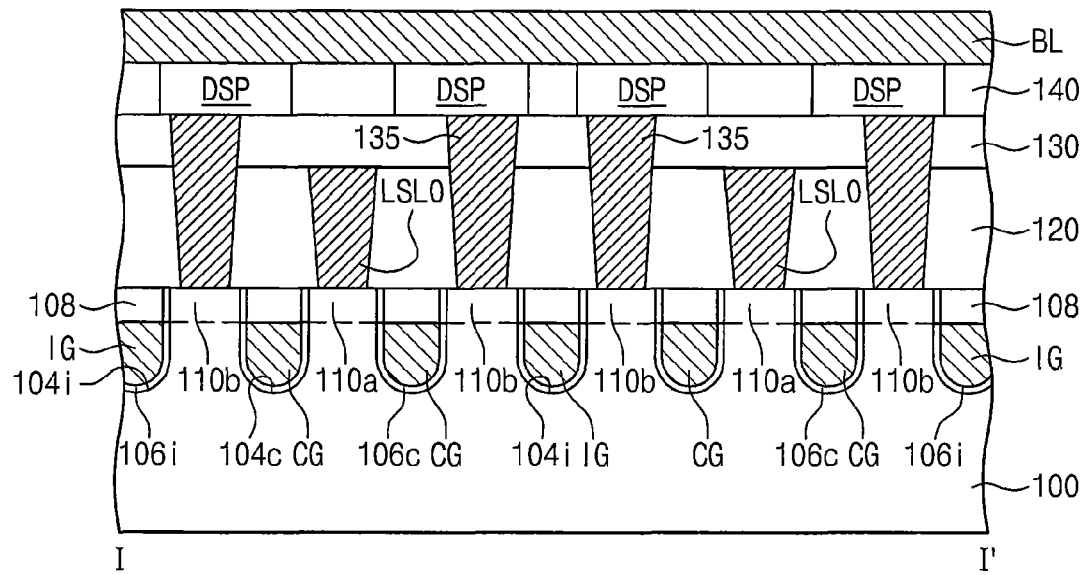
FIGS. 10A and 10B are sectional views taken along lines I-I' and II-II", respectively, of FIG. 9 to illustrate the semiconductor memory device.
Figure 10B:
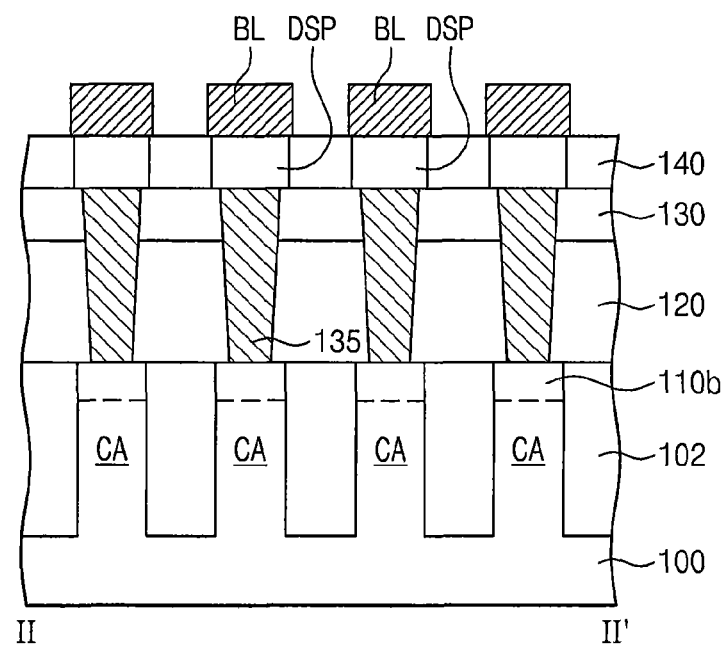

FIG. 9 is an enlarged plan view of a portion A of FIG. 8 and illustrates semiconductor memory devices according to some embodiments of the inventive concept. FIGS. 10A and 10B are sectional views, which are taken along lines I-I' and II-II", respectively, of FIG. 9 to illustrate semiconductor memory devices.

Referring to FIGS. 9, 10A, and 10B, device isolation patterns 102 may be formed on a semiconductor substrate 100 to define active line patterns ALP. The semiconductor substrate 100 may be a silicon wafer, a germanium wafer, and/or a silicon-germanium wafer. Each of the active line patterns ALP may be defined between a pair of the device isolation patterns 102 disposed adjacent to each other. In some embodiments, the active line patterns ALP may be disposed spaced apart from each other in the first direction D1 and may be a line-shaped structure extending parallel to the second direction D2 or perpendicular to the first direction D1.

The device isolation patterns 102 may extend parallel to the active line patterns ALP adjacent thereto or the second direction D2. The active line patterns ALP may be doped to have a first conductivity type.

Isolation recess regions 104i may be formed in the semiconductor substrate 100 to cross the active line patterns ALP and the device isolation patterns 102. When viewed in a plan view, the isolation recess regions 104i may extend parallel to the first direction D1 and each of them may be groove shaped. The isolation recess regions 104i may separate each of the line-shaped active line patterns ALP into cell active portions CA. Each cell active portion CA may be a portion of the active line pattern ALP that is located between a pair of the isolation recess regions 104i adjacent to each other. For example, each cell active portion CA may be defined by a pair of the device isolation patterns 102 adjacent to each other and a pair of the isolation recess regions 104i adjacent to each other. When viewed in a plan view, the cell active portions CA may be arranged in rows and in columns. Each of rows of the cell active portions CA may be arranged along the second direction D2, and each of columns of the cell active portions CA may be arranged along the first direction D1 between a pair of the isolation recess regions 104i.

Gate recess regions 104c may be formed in the semiconductor substrate 100 to cross the cell active portions CA and the device isolation patterns 102. Each of the gate recess regions 104c may be a groove shaped region extending parallel to the isolation recess regions 104i. In some embodiments, a pair of the gate recess regions 104c may be formed to cross one of the columns of the cell active portions CA. In other words, the pair of the gate recess regions 104c may be formed between adjacent ones of the isolation recess regions 104i. In this case, a pair of the cell transistors may be formed on each cell active portion CA.

The gate recess region 104c may be formed to have a depth that is substantially equivalent to that of the isolation recess region 104i. A width of the gate recess region 104c may be the same as or different from that of the isolation recess region 104i. Each of the gate and isolation recess regions 104c and 104i may have a depth that is less than that of a bottom surface of the device isolation pattern 102.

Cell gate electrodes CG may be provided in the gate recess regions 104c, respectively, and a cell gate dielectric 106c may be provided between the cell gate electrode CG and the gate recess region 104c. The cell gate electrodes CG may extend parallel to the first direction D1 or across the active line pattern ALP, and each of them may be a line shaped structure. A cell transistor with the cell gate electrode CG may be configured to use a portion of the substrate 10, which may be recessed by the gate recess region 104c, as a channel region thereof.

Isolation gate electrodes IG may be provided in the isolation recess regions 104i, respectively, and an isolation gate dielectric layer 106i may be provided between the isolation gate electrode IG and the isolation recess region 104i, respectively. The isolation gate electrode IG may extend parallel to the first direction D1 and be line shaped.

Gate hardmask patterns 108 may be provided on the cell and isolation gate electrodes CG and IG, respectively. The gate hardmask patterns 108 may be provided in the cell and recess regions 104 and 104i, respectively. In some embodiments, the gate hardmask patterns 108 may have top surfaces that are substantially coplanar with the top surface of the semiconductor substrate 100.

When the semiconductor memory device is operated, an isolation voltage may be applied to at least one of the isolation gate electrodes IG. This makes it possible to prevent an unintended channel region from being formed on an inner surface of the isolation recess region 104i. For example, isolation channel regions, which are located near each isolation gate electrode IG, may be turned off by the isolation voltage. Accordingly, the cell active portions CA in each active line pattern ALP may be electrically separated from each other. For example, in the case where the active line pattern ALP is p-type, the isolation voltage may be a ground voltage or a negative voltage.

The cell gate electrode CG may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide). In example embodiments, the isolation gate electrode IG may be formed of the same material as the cell gate electrode CG. The cell gate dielectric layer 106c and the isolation gate dielectric layer 106i may include at least one of oxides (e.g., silicon oxide), nitrides (e.g., silicon nitride), oxynitrides (e.g., silicon oxynitride), and/or high-k dielectrics (such as insulating metal oxides (e.g., hafnium oxide or aluminum oxide)). The gate hardmask pattern 108 may include oxides (e.g., silicon oxide), nitrides (e.g., silicon nitride) and/or oxynitrides (e.g., silicon oxynitride).

A first impurity region 110a may be formed in each cell active portion CA at a side of each cell gate electrode CG, and a second impurity region 110b may be formed in each cell active portion CA at another side of each cell gate electrode CG. In example embodiment, the first impurity region 110a may be formed in each cell active portion CA between a pair of the cell gate electrodes CG, and a pair of the second impurity regions 110b may be formed in edge portions, respectively, of each cell active portion CA positioned outside the pair of the cell gate electrodes CG. In this case, the pair of the cell transistors formed in each cell active portion CA may share the first impurity region 110a. The first and second impurity regions 110a and 110b may serve as source/drain regions of the cell transistor. The first and second impurity regions 110a and 110b may be doped to have a second conductivity type that is different from the first conductivity type of the cell active portion CA. One of the first and second conductivity types may be n-type, and the other p-type.

Next, a first interlayered insulating layer 120 may be provided on the semiconductor substrate 100. The local source lines LSL0 may be formed in the first interlayered insulating layer 120 to extend parallel to the first direction D1. When viewed in a plan view, each of the local source lines LSL0 may be provided between adjacent ones of the cell gate electrodes CG. Each of the local source lines LSL0 may be electrically coupled to the first impurity regions 110a arranged along the first direction D1. In some embodiments, as shown in FIG. 8, end portions of the local source lines LSL0 provided in each memory segment may both be connected to the connection source line SCL0, and the connection source line SCL0 may be coupled to the source line SL0. In other words, the local source lines LSL0 in each memory segment may be electrically connected to each other to be in a substantially equipotential state.

The top surface of the local source line LSL0 may be substantially coplanar with that of the first interlayered insulating layer 120. The local source line LSL0 may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

A capping interlayered insulating layer 130 may be provided on the first interlayered insulating layer 120. The capping interlayered insulating layer 130 may be formed to cover the top surfaces of the local source lines LSL0. In the case where the local source lines LSL0 include a metal, the capping interlayered insulating layer 130 may be formed of an insulating material capable of preventing metallic atoms from being diffused from the local source lines LSL0 to a second interlayered insulating layer 140. In addition, the capping interlayered insulating layer 130 may be formed of an insulating material having an etch selectivity with respect to the first interlayered insulating layer 120. For example, the first interlayered insulating layer 120 may be formed of oxide (e.g., silicon oxide), and the capping interlayered insulating layer 130 may be formed of nitride (e.g., silicon nitride) and/or oxynitride (e.g., silicon oxynitride).

Contact plugs 135 may be provided to penetrate the capping interlayered insulating layer 130 and the first interlayered insulating layer 120. The contact plugs 135 may be electrically connected to the second impurity regions 110b, respectively. In some embodiments, ohmic patterns may be provided between the contact plugs 135 and the second impurity region 110b and between the local source line LSL0 and the first impurity region 110a. The ohmic patterns may include metal-semiconductor compound, such as metal silicide (e.g., cobalt silicide or titanium silicide).

Data storing patterns DSP may be provided on the capping interlayered insulating layer 130. The data storing patterns DSP may be connected to the contact plugs 135, respectively. In other words, the data storing patterns DSP may be electrically coupled to the second impurity regions 110b, respectively. When viewed in a plan view, the data storing patterns DSP may be two-dimensionally arranged to form a plurality of rows and a plurality of columns. In some embodiments, the data storing pattern DSP may include one of magnetic tunnel junctions, transition metal oxides, or phase-changeable materials.

A second interlayered insulating layer 140 may be provided on the capping interlayered insulating layer 130. In some embodiments, the second interlayered insulating layer 140 may be provided to fill gap regions between the data storing patterns DSP and may have top surfaces that are substantially coplanar with those of the data storing patterns DSP. In some embodiments, the second interlayered insulating layer 140 may be provided to cover the top surfaces of the data storing patterns DSP. The second interlayered insulating layer 140 may be formed of or include at least one of oxides (e.g., silicon oxide), nitrides (e.g., silicon nitride), or oxynitrides (e.g., silicon oxynitride).

The bit lines BL may be provided on the data storing patterns DSP and the second interlayered insulating layer 140. The bit lines BL may extend parallel to the second direction D2 and each of them may be electrically connected to the data storing patterns DSP arranged along the second direction D2. In example embodiments, the bit lines BL may be in contact with the top surfaces of the data storing patterns DSP. When viewed in a plan view, the bit lines BL may be provided in such a way that each of them overlaps a corresponding one of the active line patterns ALP. In some embodiments, upper electrodes may be formed on the data storing patterns DSP, respectively, in place of or below the bit line BL.

FIGS. 11A through 11F are schematic illustrations of data storage in semiconductor memory devices according to some embodiments of the inventive concept.

Figure 11A:
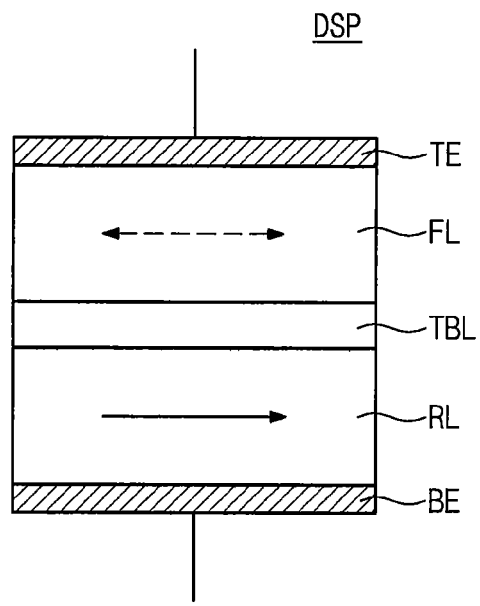
FIGS. 11A through 11F are diagrams illustrating examples of data storing patterns of a semiconductor memory device according to some embodiments of the inventive concept.
Figure 11B:
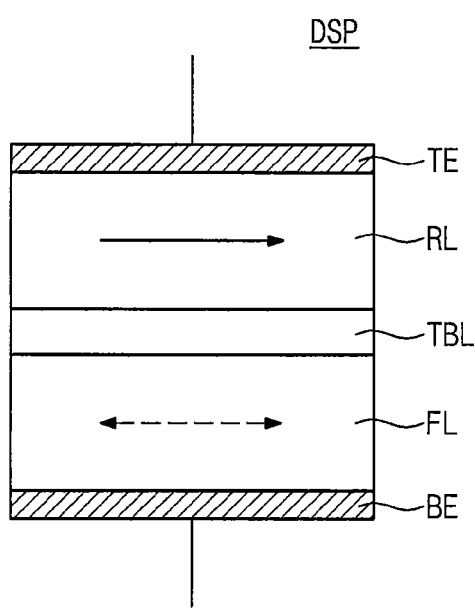

As shown in FIGS. 11A and 11B, a data storing pattern DSP may include a reference magnetic layer RL, a free magnetic layer FL, and a tunnel barrier layer TBL between the reference magnetic layer RL and the free magnetic layer FL. The reference magnetic layer RL has a fixed magnetization direction, and the free magnetic layer FL has a switchable magnetization direction that can be changed to be parallel or anti-parallel to that of the reference magnetic layer RL. The magnetization directions of the reference and free magnetic layers RL and FL may be parallel to a top surface of the tunnel barrier layer TBL. The reference magnetic layer RL, the free magnetic layer FL, and the tunnel barrier layer TBL may constitute a magnetic tunnel junction (MTJ).

The electrical resistance of the MTJ may be greater when the reference and free magnetic layers RL and FL have anti-parallel magnetization directions relative to one another, compared to when the magnetization directions are parallel. The electric resistance of the MTJ may be controlled by changing the magnetization direction of the free layer. The magnetization direction of the free magnetic layer FL may be changed using spin torque transfer phenomena of electrons constituting a write current. The resistance characteristics of the magnetic tunnel junction may be used as a mechanism to store data in the data storing pattern DSP.

Each of the reference and free magnetic layers RL and FL may include a ferromagnetic material. In some embodiments, the reference magnetic layer RL may further include an antiferromagnetic material for pinning the magnetization direction of the ferromagnetic material of the reference magnetic layer RL. The tunnel barrier layer TBL may include at least one of magnesium oxide, titanium oxide, aluminum oxide, magnesium-zinc oxide, or magnesium-boron oxide.

The data storing pattern DSP may further include a bottom electrode BE and a top electrode TE, and in this case, the reference magnetic layer RL, the tunnel barrier layer TBL, and the free magnetic layer FL may be disposed between the bottom electrode BE and the top electrode TE. As illustrated in FIG. 11A, the reference magnetic layer RL may be disposed between the bottom electrode BE and the tunnel barrier layer TBL, and the free magnetic layer FL may be disposed between the top electrode TE and the tunnel barrier layer TBL. In some embodiments, as illustrated in FIG. 11B, the free magnetic layer FL may be disposed between the bottom electrode BE and the tunnel barrier layer TBL, and the reference magnetic layer RL may be disposed between the top electrode TE and the tunnel barrier layer TBL. The bottom and top electrodes BE and TE may include a conductive metal nitride (e.g., titanium nitride, tantalum nitride, and/or tungsten nitride).

Figure 11C:
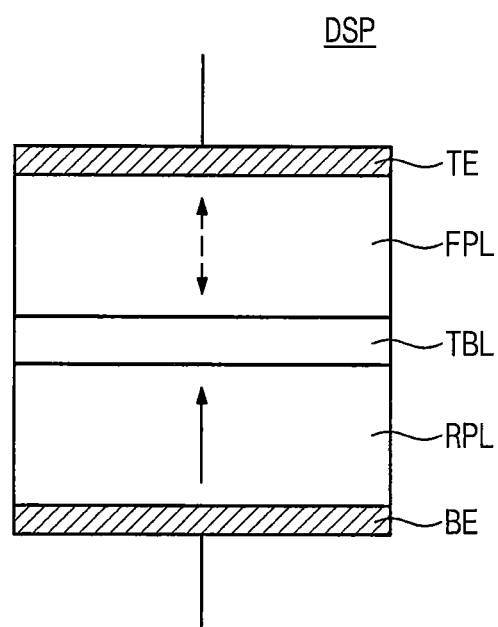

As illustrated in FIG. 11C, a data storing pattern DSP may include a reference perpendicular magnetic layer RPL, a free perpendicular magnetic layer FPL, and a tunnel barrier layer TBL between the reference and free perpendicular magnetic layers RPL and FPL. The reference perpendicular magnetic layer RPL has a magnetization direction fixed in one direction, and the free perpendicular magnetic layer FPL may have a changeable magnetization direction between a direction that is parallel to and a direction that is anti-parallel to the magnetization direction of the reference perpendicular magnetic layer RPL. The magnetization directions of the reference and free perpendicular magnetic layers RPL and FPL may be substantially perpendicular to a top surface of the tunnel barrier layer TBL.

The reference and free perpendicular magnetic layers RPL and FPL may include a perpendicular magnetic material (e.g., CoFeTb, CoFeGd, and/or CoFeDy), a perpendicular magnetic material having a $L1_0$ structure, or CoPt having a hexagonal close packed (HCP) lattice structure. Here, the perpendicular magnetic material having the $L1_0$ structure may include at least one of FePt of the $L1_0$ structure, FePd of the $L1_0$ structure, CoPd of the $L1_0$ structure, or CoPt of the $L1_0$ structure.

In some embodiments, the reference and free perpendicular magnetic layers RPL and FPL may include magnetic layers and non-magnetic layers which are alternately and repeatedly stacked. For example, each of the reference and free perpendicular magnetic layers RPL and FPL may include at least one of (Co/Pt)n, (CoFe/Pt)n, (CoFe/Pd)n, (Co/Pd)n, (Co/Ni)n, (CoNi/Pt)n, (CoCr/Pt)n, or (CoCr/Pd)n, where "n" is a natural number equal to or greater than 2. Here, the reference perpendicular magnetic layer RPL may be thicker than the free perpendicular magnetic layer FPL, and/or a coercive force of the reference perpendicular magnetic layer RPL may be greater than that of the free perpendicular magnetic layer FPL.

The tunnel barrier layer TBL may include at least one of magnesium oxide, titanium oxide, aluminum oxide, magnesium-zinc oxide, or magnesium-boron oxide.

The data storing pattern DSP may further include a bottom electrode BE and a top electrode TE. The bottom and top electrodes BE and TE may be formed of a conductive metal nitride. The reference perpendicular magnetic layer RPL, the tunnel barrier layer TBL, and the free perpendicular magnetic layer FPL may be sequentially stacked between the bottom electrode BE and the top electrode TE. In some embodiments, the positions of the reference and free perpendicular magnetic layers RPL and FPL may be reversed with each other. In other words, the free perpendicular magnetic layer FPL, the tunnel barrier layer TBL, and the reference perpendicular magnetic layer RPL may be sequentially stacked between the bottom electrode BE and the upper electrode TE.

Figure 11D:
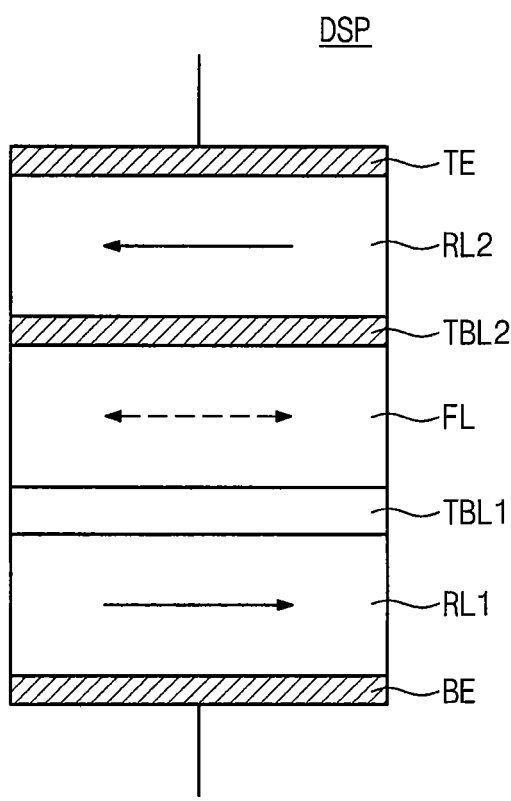

According to some embodiments illustrated in FIG. 11D, a data storing pattern DSP includes first and second magnetic tunnel junction (MTJ) patterns.

In more detail, the data storing pattern DSP may include a first reference magnetic layer RL1, a first tunnel barrier layer TBL1, a free magnetic layer FL, a second tunnel barrier layer TBL2, and a second reference magnetic layer RL2 which are sequentially stacked. Here, a thickness of the first tunnel barrier layer TBL1 may be different from a thickness of the second tunnel barrier layer TBL2. In this data storing pattern DSP, the first reference magnetic layer RL1, the first tunnel barrier layer TBL1, and the free magnetic layer FL may constitute the first MTJ, and the free magnetic layer FL, the second tunnel barrier layer TBL2, and the second reference magnetic layer RL2 may constitute the second MTJ.

The first and second reference magnetic layers RL1 and RL2 may have fixed magnetization directions. Here, the magnetization direction of the first reference magnetic layer RL1 may be anti-parallel to the magnetization direction of the second reference magnetic layer RL2. The free magnetic layer FL may have a magnetization direction that is changeable between a direction that is parallel to and a direction that is anti-parallel to any one of the magnetization directions of the first and second reference magnetic layers RL1 and RL2. The magnetization directions of the free magnetic layer FL and the first and second reference magnetic layers RL1 and RL2 may be substantially parallel or perpendicular to top surfaces of the first and second tunnel barrier layers TBL1 and TBL2.

The data storing pattern DSP may include a bottom electrode BE and a top electrode TE. The bottom and top electrodes BE and TE may be formed of a conductive metal nitride. The reference magnetic layer RL1, the first tunnel barrier layer TBL1, the free magnetic layer FL, the second tunnel barrier layer TBL2, and the second reference magnetic layer RL2 may be sequentially stacked between the bottom electrode BE and the upper electrode TE.

Figure 11E:
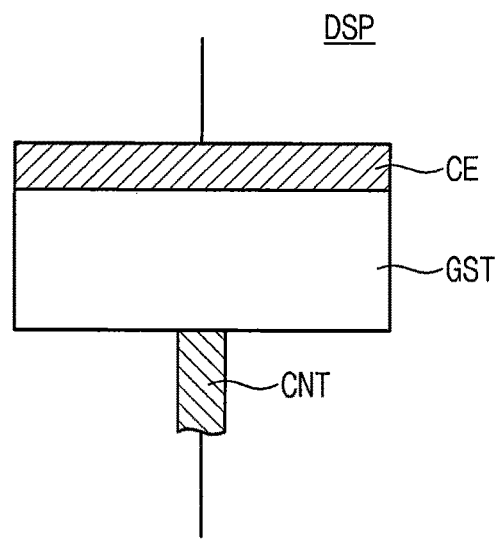

In some embodiments as illustrated in FIG. 11E, a data storing pattern DSP may include a phase change material pattern GST and a capping electrode CE that are sequentially stacked. A phase of the phase change material pattern GST may be changed into a crystalline state or an amorphous state by a temperature of a supplied heat and/or a time that the heat that is supplied. The phase change material pattern GST in the crystalline state may have a resistivity that is less than that of the phase change material pattern GST in the amorphous state. The data storing pattern DSP may store the data based on a difference in the resistivity caused by the change of the phase of the phase change material pattern GST. In some embodiments, a cell contact plug CNT contacting the phase change material pattern GST may be used as a heating electrode. In this case, a portion of the phase change material pattern GST adjacent to the cell contact plug CNT may correspond to a programmable region. A phase of the programmable region may be changed into any crystalline state or the amorphous state.

The phase change material pattern GST may include at least one of as tellurium (Te) and selenium (Se) which are chalcogenide elements. For example, the phase change material GST may include at least one of Ge—Sb—Te, As—Sb—Te, As—Ge—Sb—Te, Sn—Sb—Te, Ag—In—Sb—Te, In—Sb—Te, (5A group element)-Sb—Te materials, (6A group element)-Sb—Te materials, (5A element)-Sb—Se materials, (6A group element)-Sb—Se materials, Ge—Sb, In—Sb, Ga—Sb, or a doped Ge—Sb—Te. Here, the doped Ge—Sb—Te may be doped with at least one of C, N, B, Bi, Si, P, Al, Dy, or Ti. Each of the capping electrode CE and the cell contact plug CNT may include at least one of a doped semiconductor material (e.g., doped silicon), a metal (e.g., tungsten, aluminum, titanium, and/or tantalum), a conductive metal nitride (e.g., titanium nitride, tantalum nitride, and/or tungsten nitride), or a metal-semiconductor compound (e.g., a metal silicide).

Figure 11F:
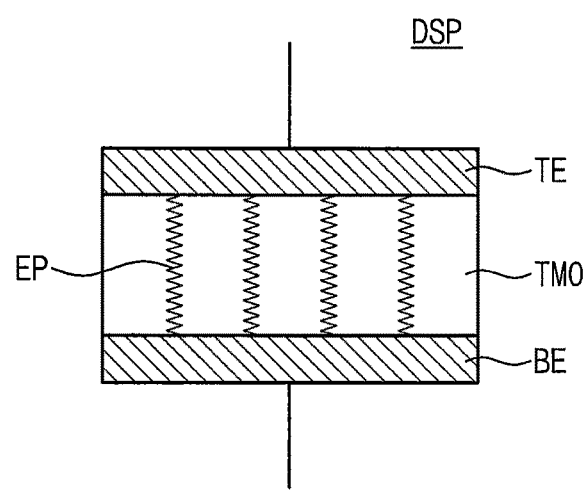

In some embodiments as illustrated in FIG. 11F, a data storing pattern DSP may include a bottom electrode BE, a top electrode TE, and a transition metal oxide pattern TMO disposed between the bottom electrode BE and top electrode TE. At least one electrical path EP may be created or lost in the transition metal oxide pattern TMO by a programming operation. Both ends of the electrical path EP may be connected to the bottom and top electrodes BE and TE, respectively. The data storing pattern DSP may have a low resistance value in the event that the electrical path EP is created, but the data storing pattern DSP may have a high resistance value when the electrical path EP is lost. The data storing pattern DSP may store data using a resistance value difference caused by the electrical path EP. The electrical path EP may be created or lost by a programming operation.

For example, the transition metal oxide pattern TMO may include at least one of niobium oxide, titanium oxide, nickel oxide, zirconium oxide, vanadium oxide, (Pr,Ca)MnO$_3$ (PCMO), strontium-titanium oxide, barium-strontium-titanium oxide, strontium-zirconium oxide, barium-zirconium oxide, or barium-strontium-zirconium oxide.

The bottom and top electrode BE and TE may include at least one of a conductive metal nitride (e.g., titanium nitride or tantalum nitride), a transition metal (e.g., titanium or tantalum), or a rare-earth element (e.g., ruthenium or platinum).

Figure 12:
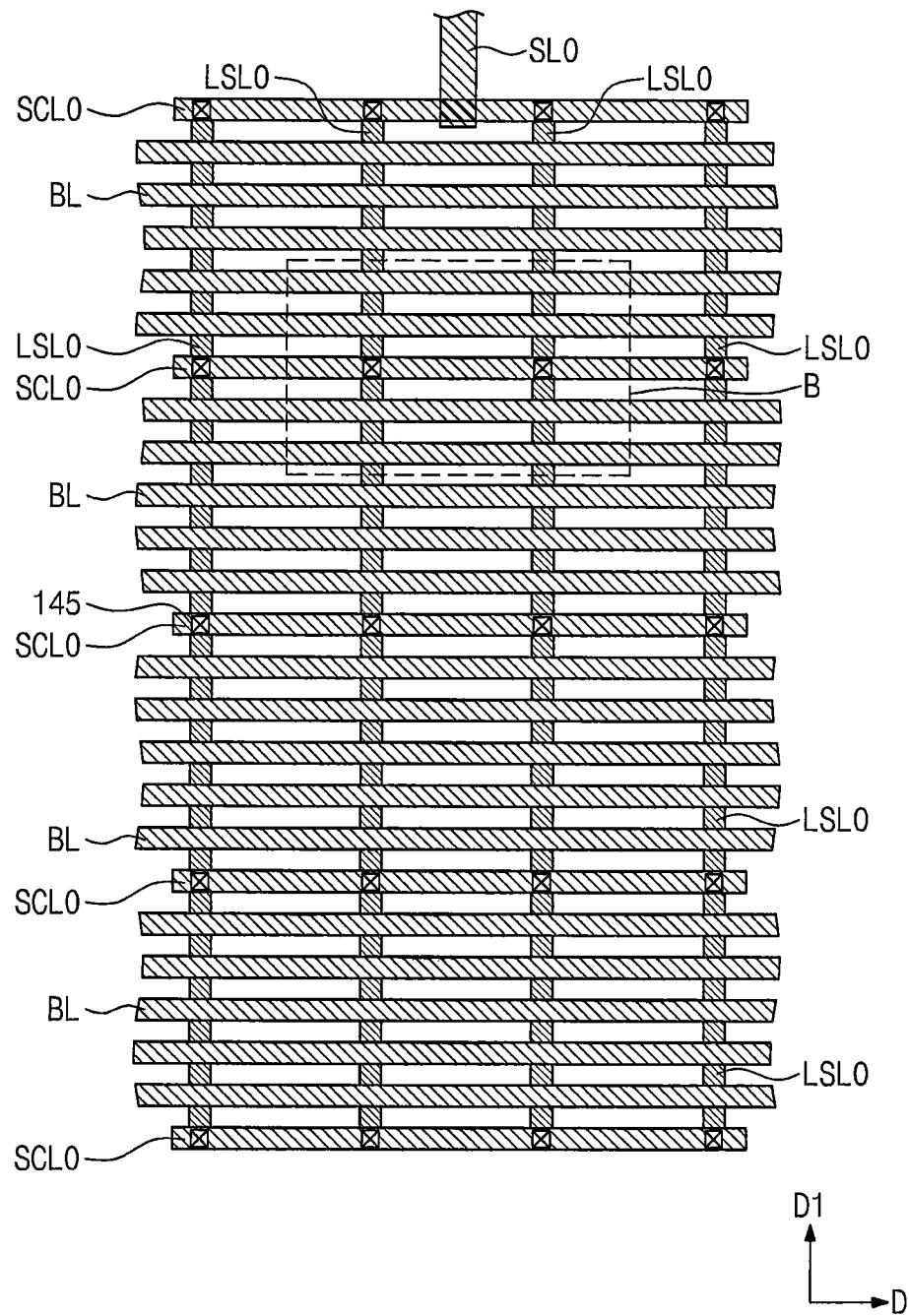
FIG. 12 is a schematic plan view illustrating semiconductor memory devices according to some embodiments of the inventive concept.

FIG. 12 is a schematic plan view illustrating semiconductor memory devices according to some embodiments of the inventive concept, Although one memory region is illustrated in FIG. 12, a semiconductor memory device may include a plurality of memory regions, as described, for example, with reference to FIG. 8.

Referring to FIG. 12, each memory region may include a plurality of word lines, a plurality of bit lines BL, and a plurality of local source lines LSL0. Furthermore, each memory region may include the source connection lines SCL0 that are electrically connected to the lower source lines LSL0. Due to the presence of the source connection lines SCL0, it is possible to reduce electric resistance of an electric pathway including the local source line LSL0 and thereby to efficiently transmit electric signals from the source line SL0 to the local source lines LSL0.

In detail, the local source lines LSL0 may extend parallel to the first direction D1, and the source connection lines SCL0 may extend across the local source lines LSL0 or parallel to the second direction D2. The source connection lines SCL0 may be parallel to the bit lines BL and may be disposed spaced apart in the first direction D1 from each other by a specific distance. A plurality of bit lines BL may be disposed between the source connection lines SCL0 adjacent to each other. The source connection lines SCL0 may be shorter than the bit lines BL. In addition, the source connection lines SCL0 respectively provided in different memory regions may be disposed spaced apart from each other.

Figure 13:
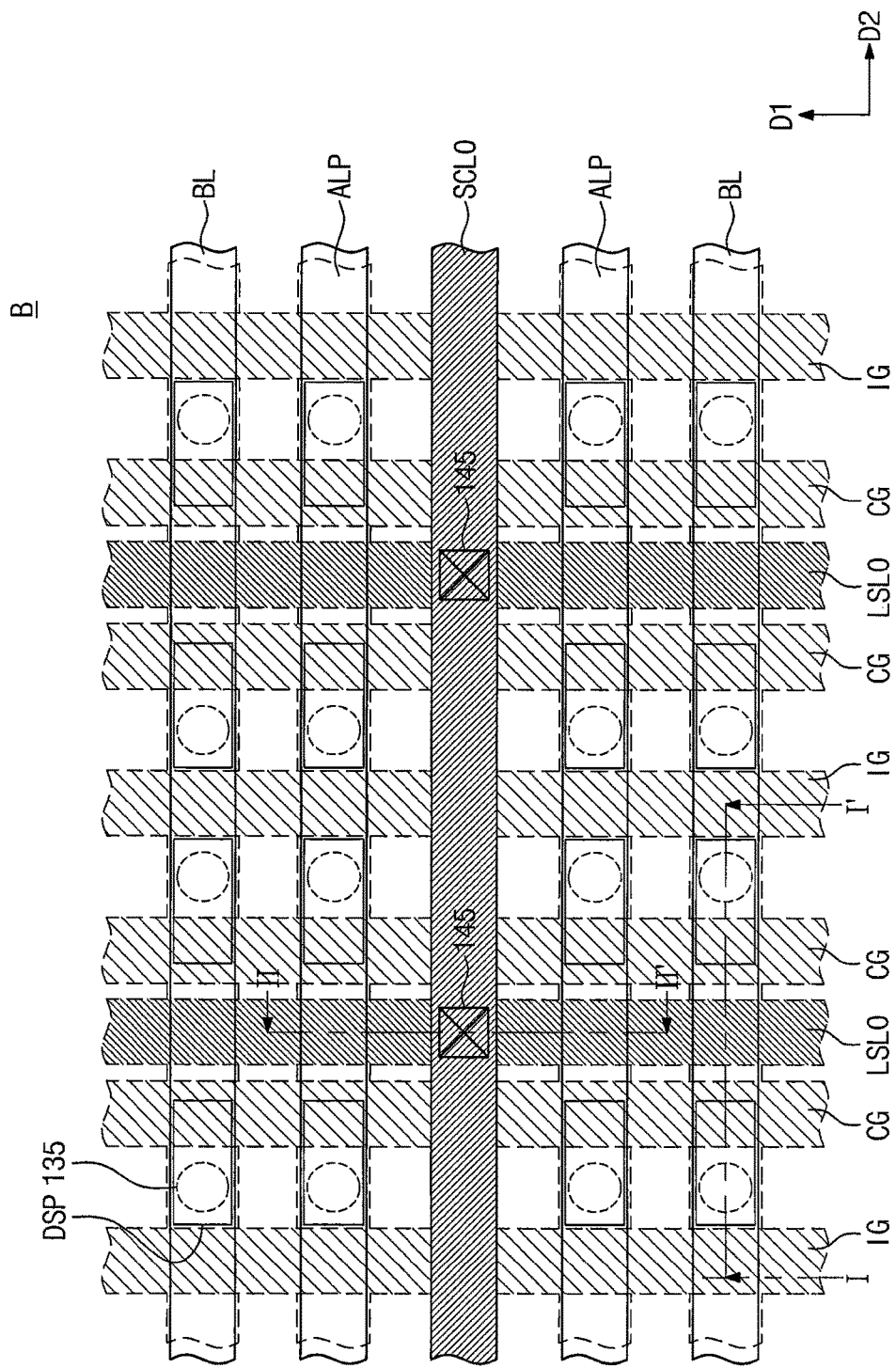
FIG. 13 is an enlarged plan view of a portion A of FIG. 12.
Figure 14:
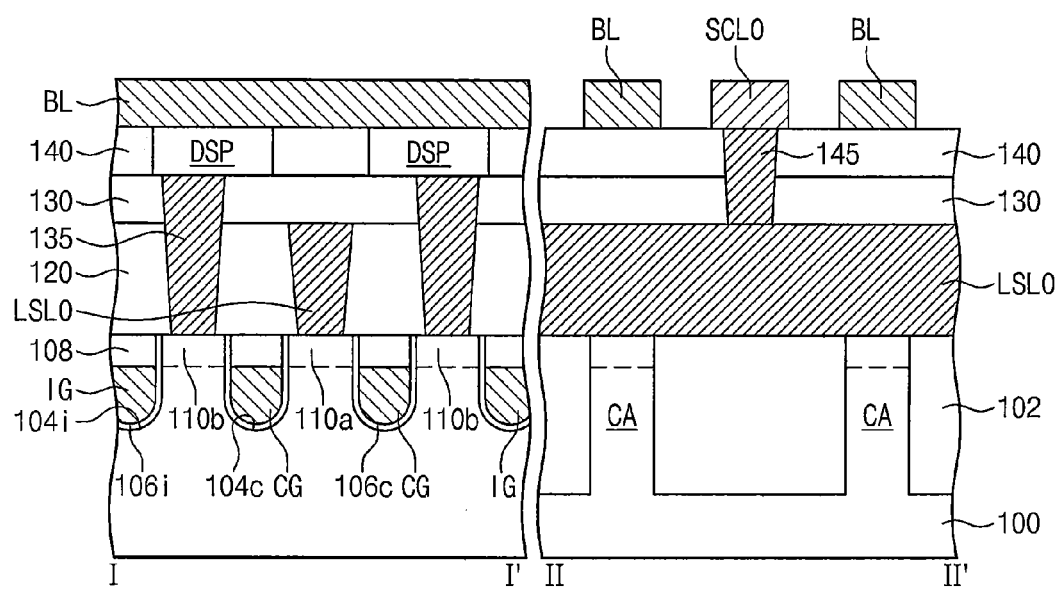
FIG. 14 is a sectional view taken along lines I-I' and II-II" of FIG. 13 to illustrate the semiconductor memory device.

FIG. 13 is an enlarged plan view of a portion A of FIG. 12 and illustrates a portion of the semiconductor memory device according to some embodiments of the inventive concept, and FIG. 14 is a sectional view, which is taken along lines I-I' and II-II" of FIG. 13 to illustrate the semiconductor memory device according to some embodiments of the inventive concept.

Referring to FIGS. 13 and 14, the device isolation patterns 102 may be formed on the semiconductor substrate 100 to define the active line patterns ALP. The active line patterns ALP may be disposed spaced apart from each other in the first direction D1 and may be line-shaped and extend parallel to the second direction D2 or perpendicular to the first direction D1. The isolation recess regions 104$i$ may be formed in the semiconductor substrate 100 to cross the active line patterns ALP and the device isolation patterns 102. A pair of gate recess regions 104$c$ may be formed between adjacent ones of the isolation recess regions 104$i$.

The cell gate electrodes CG may be provided in the gate recess regions 104$c$, respectively, and the cell gate dielectric layer 106$c$ may be provided between the cell gate electrode CG and the gate recess region 104$c$. The isolation gate electrodes IG may be provided in the isolation recess regions 104$i$, respectively, and the isolation gate dielectric layer 106$i$ may be provided between the isolation gate electrode IG and the isolation recess region 104$i$. The cell gate electrodes CG and the isolation gate electrodes IG may extend parallel to the first direction D1. The gate hardmask patterns 108 may be provided on the cell and isolation gate electrodes CG and IG, respectively. In some embodiments, the gate hardmask patterns 108 may have top surfaces that are substantially coplanar with the top surface of the semiconductor substrate 100.

The first impurity region 110$a$ may be formed in a portion of the cell active portion CA positioned at a side of the cell gate electrode CG, and the second impurity region 110$b$ may be formed in another portion of the cell active portion CA positioned at an opposite side of the cell gate electrode CG. In some embodiments, the first impurity region 110$a$ may be formed in a portion of the cell active portion CA positioned between a pair of the cell gate electrodes CG, and a pair of the second impurity regions 110$b$ may be formed in edge portions of the cell active portion CA positioned outside the pair of the cell gate electrodes CG. In this case, the pair of the cell transistors formed in each cell active portion CA may share the first impurity region 110$a$.

The first interlayered insulating layer 120 may be provided on the semiconductor substrate 100. The local source lines LSL0 may be formed in the first interlayered insulating layer 120 to extend parallel to the first direction D1. When viewed in plan view, each of the local source lines LSL0 may be provided between adjacent ones of the cell gate electrodes CG. Each of the local source lines LSL0 may be electrically coupled to the first impurity regions 110$a$ arranged along the first direction D1.

In some embodiments, end portions of the local source lines LSL0 provided in each memory segment may be connected in common to the connection source line SCL0, and the connection source line SCL0 may be coupled to the source line SL0. In other words, the local source lines LSL0 in each memory segment may be electrically connected to each other to be in a substantially equipotential state.

The capping interlayered insulating layer 130 may be provided on the first interlayered insulating layer 120. The capping interlayered insulating layer 130 may be formed to cover the top surfaces of the local source lines LSL0. The contact plugs 135 may be provided to penetrate the capping interlayered insulating layer 130 and the first interlayered insulating layer 120. The contact plugs 135 may be electrically connected to the second impurity regions 110$b$, respectively.

The data storing patterns DSP may be provided on the capping interlayered insulating layer 130. The data storing patterns DSP may be connected to the contact plugs 135, respectively. In other words, the data storing patterns DSP may be electrically coupled to the second impurity regions 110$b$, respectively. The second interlayered insulating layer 140 may be provided on the capping interlayered insulating layer 130. In some embodiments, the second interlayered insulating layer 140 may be provided to fill gap regions between the data storing patterns DSP and have a top surface that is substantially coplanar with those of the data storing patterns DSP. In some embodiments, the second interlayered insulating layer 140 may be provided to cover the top surfaces of the data storing patterns DSP.

In some embodiments, the bit lines BL and the source connection line SCL0 may be provided on the second interlayered insulating layer 140. For example, the source connection line SCL0 may be provided at substantially the same level as the bit lines BL, when measured from the top surface of the semiconductor substrate 100. The bit lines BL and the source connection line SCL0 may extend parallel to the second direction D2 and each of the bit lines BL may be electrically connected to the data storing patterns DSP arranged along the second direction D2. The source connection line SCL0 may be connected to the local source lines LSL0 through upper contact plugs 145, which are formed to penetrate the capping interlayered insulating layer 130 and the second interlayered insulating layer 140.

Figure 15:
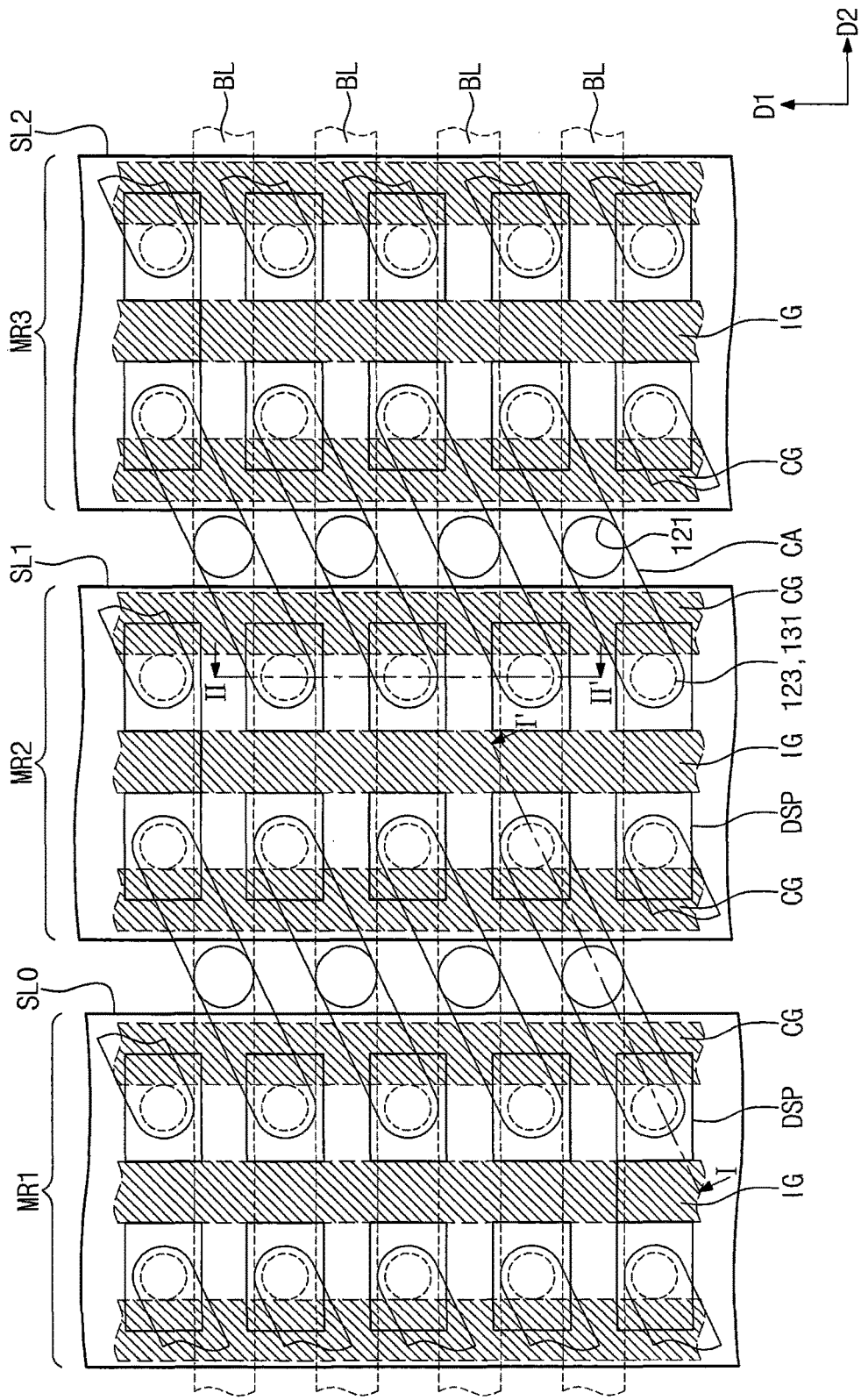
FIG. 15 is a plan view illustrating semiconductor memory devices according to some embodiments of the inventive concept.
Figure 16:
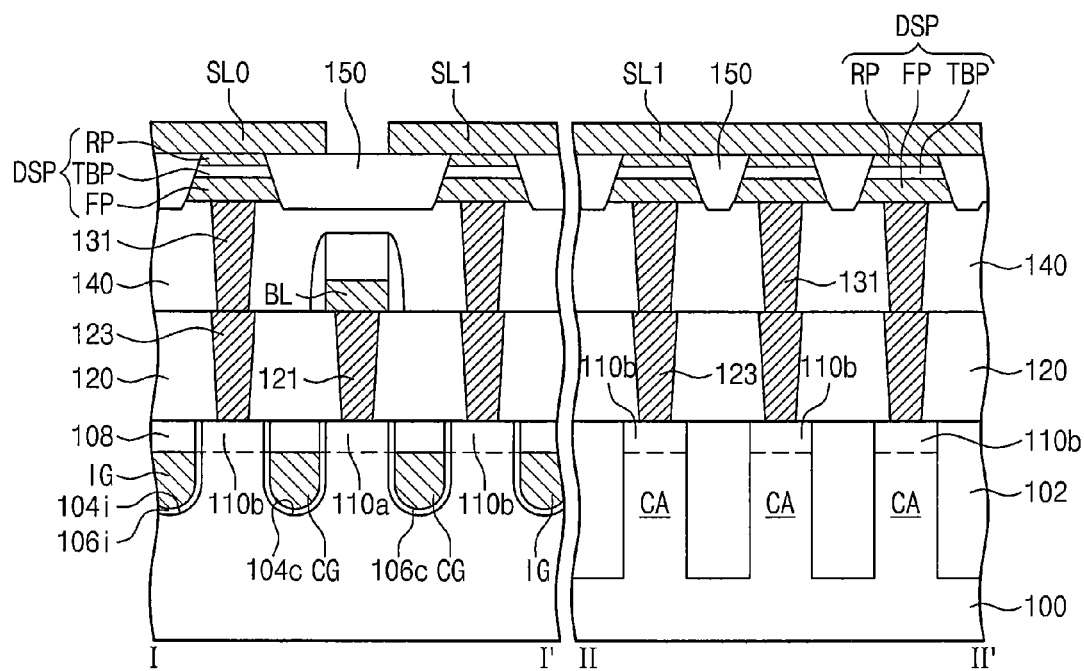
FIG. 16 is a sectional view taken along lines I-I' and II-II" of FIG. 15.

FIG. 15 is a plan view illustrating semiconductor memory devices according to some embodiments of the inventive concept, and FIG. 16 is a sectional view taken along lines I-I' and II-II" of FIG. 15.

Referring to FIGS. 15 and 16, the semiconductor substrate 100 may include a plurality of memory regions. For example, the semiconductor substrate 100 may include first to third memory regions MR1, MR2, and MR3. The semiconductor substrate 100 may be a silicon wafer, a germanium wafer, and/or a silicon-germanium wafer.

The device isolation patterns 102 may be formed on the semiconductor substrate 100 to define cell active portions CA. In some embodiments, the cell active portions CA may be two-dimensionally arranged to form a plurality of rows and a plurality of columns, and each of the cell active portions CA may be shaped like a rectangle or bar extending in a diagonal direction or at an angle to both of the first and second directions D1 and D2. For example, the cell active portions CA may constitute a plurality of rows, each of which includes some of the cell active portions CA arranged along the first direction D1, and a plurality of columns, each of which includes some of the cell active portions CA arranged along the second direction D2. The cell active portions CA may be doped to have a first conductivity type.

At least one gate recess region 104$c$ may be formed to cross each column of the cell active portions CA. The gate recess region 104$c$ may be a groove shaped structure extending along the first direction D1. A depth of the gate recess region 104$c$ may be less than a thickness of the device isolation pattern 102. In some embodiments, a pair of the gate recess regions 104$c$ may be formed to cross each column of the cell active portions CA. In this case, a pair of cell transistors may be formed on each cell active portion CA.

The isolation recess regions 104$i$ may be formed to extend parallel to the first direction D1, and the cell active portions CA may be arranged spaced apart from each other in the first direction D1, between adjacent ones of the isolation recess regions 104i. A pair of the gate recess regions 104c may be formed between each adjacent pair the isolation recess regions 104i.

The cell gate electrodes CG may be provided in the gate recess regions 104c, respectively, and the cell gate dielectric layer 106c may be provided between the cell gate electrode CG and the gate recess region 104c. The isolation gate electrodes IG may be provided in the isolation recess regions 104i, respectively, and the isolation gate dielectric layer 106i may be provided between the isolation gate electrode IG and the isolation recess region 104i. The cell gate electrodes CG and the isolation gate electrodes IG may extend parallel to the first direction D1. The gate hardmask patterns 108 may be provided on the cell and isolation gate electrodes CG and IG, respectively. In some embodiments, the gate hardmask patterns 108 may have top surfaces that are substantially coplanar with the top surface of the semiconductor substrate 100.

The first impurity region 110a may be formed in a portion of the cell active portion CA positioned at a side of the cell gate electrode CG, and the second impurity region 110b may be formed in another portion of the cell active portion CA positioned at an opposite side of the cell gate electrode CG. In some embodiments, the first impurity region 110a may be formed in each cell active portion CA between a pair of the cell gate electrodes CG, and a pair of the second impurity regions 110b may be formed in edge portions, respectively, of each cell active portion CA positioned outside the pair of the cell gate electrodes CG. In this case, the pair of the cell transistors formed in each cell active portion CA may share the first impurity region 110a.

The first interlayered insulating layer 120 may be provided on the semiconductor substrate 100. The first interlayered insulating layer 120 may be formed of an oxide layer (e.g., silicon oxide). First and second contact plugs 121 and 123 may be provided to penetrate the first interlayered insulating layer 120. The first contact plugs 121 may be electrically coupled to the first impurity regions 110a. The second contact plugs 123 may be electrically coupled to the second impurity regions 110b, respectively.

The first and second contact plugs 121 and 123 may include at least one of, for example, doped semiconductor materials (e.g., doped silicon), metals (e.g., tungsten, aluminum, titanium, and/or tantalum), conductive metal nitrides (e.g., titanium nitride, tantalum nitride, and/or tungsten nitride), or metal-semiconductor compounds (e.g., metal silicide).

In some embodiments, the bit lines BL may be provided on the first interlayered insulating layer 120 to extend parallel to the second direction D2. For example, the bit lines BL may be provided to cross the cell gate electrodes CG. In some embodiments, hard mask patterns may be provided on the bit lines BL. The bit lines BL may be electrically coupled to the first contact plugs 121 arranged along the second direction D2.

The second interlayered insulating layer 140 may be disposed on the first interlayered insulating layer 120 to cover the second contact plugs 123 and the bit lines BL.

Lower electrodes 131 may be provided to penetrate the second interlayered insulating layer 140, and the lower electrodes 131 may be electrically connected to the second contact plugs 123, respectively. In some embodiments, when viewed in plan view, the lower electrodes 131 may be arranged to be spaced apart from each other in both of the first and second directions D1 and D2. When viewed in plan view, the lower electrodes 131 may be disposed to form a zigzag shaped arrangement.

The data storing patterns DSP may be provided on the lower electrodes 131, respectively. In some embodiments, the data storing patterns DSP may be coupled to the lower electrodes 131, respectively, and each of the data storing patterns DSP may include a lower magnetic pattern FP, an upper magnetic pattern RP, and a tunnel barrier pattern TBP therebetween. When viewed in plan view, the data storing patterns DSP may be arranged to be spaced apart from each other in both of the first and second directions D1 and D2. The insulating gapfill layer 150 may be provided to fill gap regions between the data storing patterns DSP. In some embodiments, the insulating gapfill layer 150 may have a top surface that is substantially coplanar with those of the data storing patterns DSP.

In some embodiments, first to third source lines SL0, SL1, and SL2 may be provided on the insulating gapfill layer 150 and the data storing patterns DSP. For example, the first to third source lines SL0, SL1, and SL2 may extend parallel to the first direction D1 and may be disposed spaced apart from each other in the second direction D2. The first to third source lines SL0, SL1, and SL2 may be provided in the first to third memory regions MR1, MR2, and MR3, respectively, and each of the first to third source lines SL0, SL1, and SL2 may be coupled to a plurality of data storing patterns DSP that are two-dimensionally arranged along rows and columns. In some embodiments, each of the first to third source lines SL0, SL1, and SL2 may be a plate-shaped structure and may be in common contact with top surfaces of the data storing patterns DSP that are provided in each of the memory regions MR1, MR2, and MR3. For example, the first source line SL0 may be connected in common to the plurality of data storing patterns DSP provided in the first memory region MR1. In other words, the first source line SL0 on the first memory region MR1 may cover the top surfaces of the plurality of data storing patterns that are two-dimensionally arranged along rows and columns. The first source line SL0 may be in contact with top surfaces of the upper magnetic patterns RP. The second source line SL1 may be connected in common to the plurality of data storing patterns DSP provided in the second memory region MR2, In other words, the second source line SL1 on the second memory region MR2 may cover the top surfaces of the plurality of data storing patterns that are two-dimensionally arranged along rows and columns. The second source line SL1 may be in contact with top surfaces of the upper magnetic patterns RP provided in the second memory region MR2. The third source line SL2 may be connected in common to the plurality of data storing patterns DSP provided in the third memory region MR3. In other words, the third source line SL2 on the third memory region MR3 may cover the top surfaces of the plurality of data storing patterns that are two-dimensionally arranged along rows and columns (i.e., more than one row and more than one column). The third source line SL2 may be in contact with top surfaces of the upper magnetic patterns RP provided in the third memory region MR3.

Figure 17:
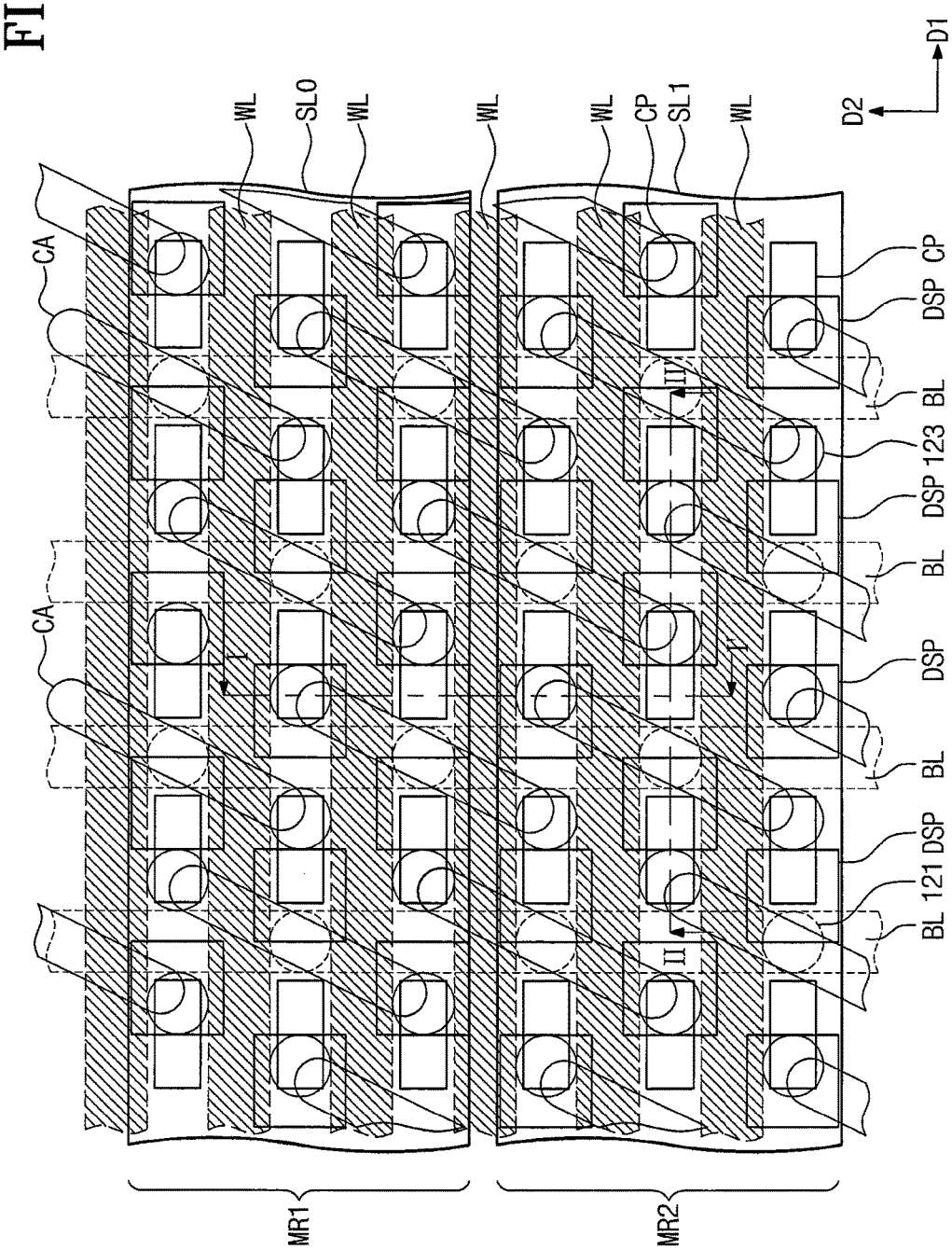
FIG. 17 is a plan view illustrating semiconductor memory devices according to some embodiments of the inventive concept.
Figure 18:
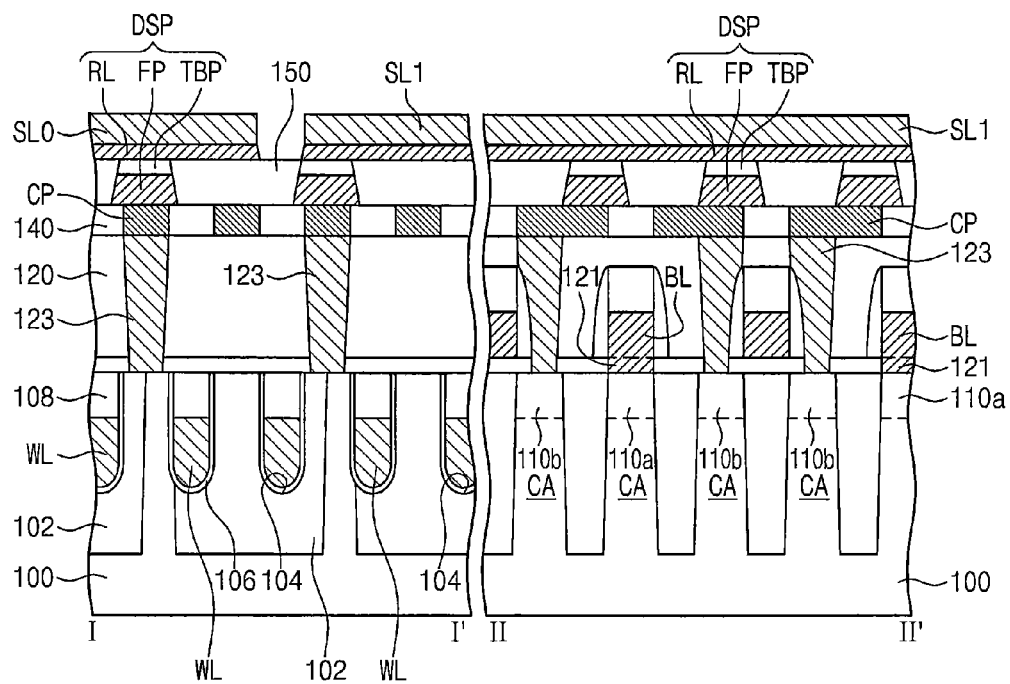
FIG. 18 is a sectional view taken along lines I-I' and II-II" of FIG. 17.

FIG. 17 is a plan view illustrating semiconductor memory devices according to some embodiments of the inventive concept, and FIG. 18 is a sectional view taken along lines I-I' and II-II" of FIG. 17.

Referring to FIGS. 17 and 18, the semiconductor substrate 100 may include a plurality of memory regions. For example, the semiconductor substrate 100 may include first and second memory regions MR1 and MR2. The semiconductor substrate 100 may be a silicon wafer, a germanium wafer, and/or a silicon-germanium wafer.

The device isolation patterns 102 may be formed on the semiconductor substrate 100 to define the cell active portions CA. According to the present embodiment, when viewed in plan view, the cell active portions CA may be disposed to form a zigzag-shaped arrangement, and this makes it possible to increase an integration density of the semiconductor memory device. Here, each of the cell active portions CA may be a bar-shaped structure, and a longitudinal axis thereof may be at an angle to the word lines WL and the bit lines BL (for example, parallel to a diagonal direction).

The word lines WL may be provided to cross the cell active portions CA and extend along a first direction D1. In some embodiments, the word lines WL may be respectively provided in the recess regions 104, which are formed by recessing the top surface of the semiconductor substrate 100, and a gate insulating layer 106 may be formed between the word lines WL and the recess regions 104. The word lines WL may be formed in such a way that top surfaces thereof are positioned at a lower level than that of the semiconductor substrate 100, and the gate hard mask pattern 108 may be formed in an upper region of the recess region 104 that is not filled with the word line WL.

The first and second impurity regions 110$a$ and 110$b$ may be formed in portions of each cell active portion CA that are positioned at both sides of each word line WL. For example, the first impurity region 110$a$ may be formed in a portion of the cell active portion CA between a pair of the word lines WL. The second impurity region 110$b$ may be formed in other portions of the cell active portion CA positioned at opposite sides of a pair of the word lines WL.

The bit lines BL may be provided on the semiconductor substrate 100 to cross the word lines WL and extend along a second direction D2. An insulating layer may be provided between the bit lines BL and the semiconductor substrate 100, and the bit lines BL may be electrically coupled to the first impurity regions 110$a$ via the first contact plugs 121 penetrating the insulating layer. The bit lines BL may be electrically coupled to the first contact plugs 121 arranged along a second direction D2.

The first interlayered insulating layer 120 may be formed to cover the bit lines BL, and the second contact plugs 123 may be formed through the first interlayered insulating layer 120 to connect the lower magnetic patterns FP electrically to the second impurity regions 110$b$, respectively. In some embodiments, the second contact plugs 123 may be provided on two end portions of each cell active portion CA or at both sides of each bit line BL.

The formation of the second contact plugs 123 may include forming contact holes to penetrate the first interlayered insulating layer 120 and expose the second impurity regions 110$b$, depositing a conductive layer to fill the contact holes, and planarizing the conductive layer. The second contact plugs 123 may be self-aligned with respect to the bit lines BL. The second contact plugs 123 may be formed of at least one of a doped poly-silicon layer, a metal layer, a metal nitride layer, a metal silicide layer, or any combination thereof.

In some embodiments, contact pads CP may be formed on the second contact plugs 123, respectively. The contact pads CP may be two-dimensionally arranged on or in the first interlayered insulating layer 120, thereby allowing for an increase in contact area between the data storing pattern DSP and the second contact plugs 123. For example, when viewed in plan view, the contact pads CP may be arranged to be spaced apart from each other in the first and second directions D1 and D2. A pair of the contact pads CP, which are adjacently disposed at both sides of the bit line BL, may extend from the second contact plugs 123 toward respectively opposite directions. In some embodiments, the second interlayered insulating layer 140 may be formed to fill a space between the contact pads CP, and the second interlayered insulating layer 140 may have a top surface that is coplanar with those of the contact pads CP.

The data storing patterns DSP may be provided on the contact pads CP. In some embodiments, the data storing patterns DSP may be coupled to the contact pads CP, respectively. When viewed in plan view, the data storing patterns DSP may be arranged to be spaced apart from each other in both of the first and second directions D1 and D2.

In some embodiments, the first and second source lines SL0 and SL1 may be provided on the data storing patterns DSP, and the first and second source lines SL0 and SL1 may extend parallel to the first direction D1 and may be spaced apart from each other in second direction D2. For example, the first source line SL0 may be connected in common to the plurality of data storing patterns DSP provided in the first memory region MR1. In other words, the first source line SL0 may cover the top surfaces of the plurality of data storing patterns DSP that are provided in the first memory region MR1 and constitute at least two columns. The second source line SL1 may be connected in common to the plurality of data storing patterns DSP provided in the second memory region MR2. For example, the second source line SL1 may cover the top surfaces of the plurality of data storing patterns DSP that are provided in the second memory region MR2 and constitute at least two columns.

Further, according to the present embodiment, the lower magnetic patterns FP of the data storing patterns DSP may be coupled to the contact pads CP, respectively. The insulating gapfill layer 150 may be provided to fill gap regions between the lower magnetic patterns FP, and upper magnetic layers RL may be formed on top surfaces of the lower magnetic patterns FP and the insulating gapfill layer 150.

The upper magnetic layers RL may be provided on the first and second memory regions MR1 and MR2, respectively. The upper magnetic layers RL may extend along the first direction D1 and may be disposed spaced apart from each other in the second direction D2. The upper magnetic layer RL of the first memory region MR1 may cover the plurality of lower magnetic patterns FP disposed on the first memory region MR1, and the upper magnetic layer RL of the second memory region MR2 may cover the plurality of lower magnetic patterns FP disposed on the second memory region MR2. The upper magnetic layer RL may be a plate shaped structure, and a bottom surface of the upper magnetic layer RL may be in contact with the insulating gapfill layer 150. Tunnel barrier patterns TBP may be interposed between the lower magnetic patterns FP and the upper magnetic layer RL. Top surfaces of the upper magnetic layers RL may be in contact with the first and second source lines SL0 and SL1, respectively.

The semiconductor memory devices disclosed above may be encapsulated using various and diverse packaging techniques. For example, the semiconductor memory devices according to the aforementioned embodiments may be encapsulated using any one of a package on package (POP) technique, a ball grid arrays (BGAs) technique, a chip scale packages (CSPs) technique, a plastic leaded chip carrier (PLCC) technique, a plastic dual in-line package (PDIP) technique, a die in waffle pack technique, a die in wafer form technique, a chip on board (COB) technique, a ceramic dual in-line package (CERDIP) technique, a plastic quad flat package (PQFP) technique, a thin quad flat package (TQFP) technique, a small outline package (SOIC) technique, a shrink small outline package (SSOP) technique, a thin small outline package (TSOP) technique, a system in package (SIP) technique, a multi-chip package (MCP) technique, a wafer-level fabricated package (WFP) technique and/or a wafer-level processed stack package (WSP) technique.

Figure 19:
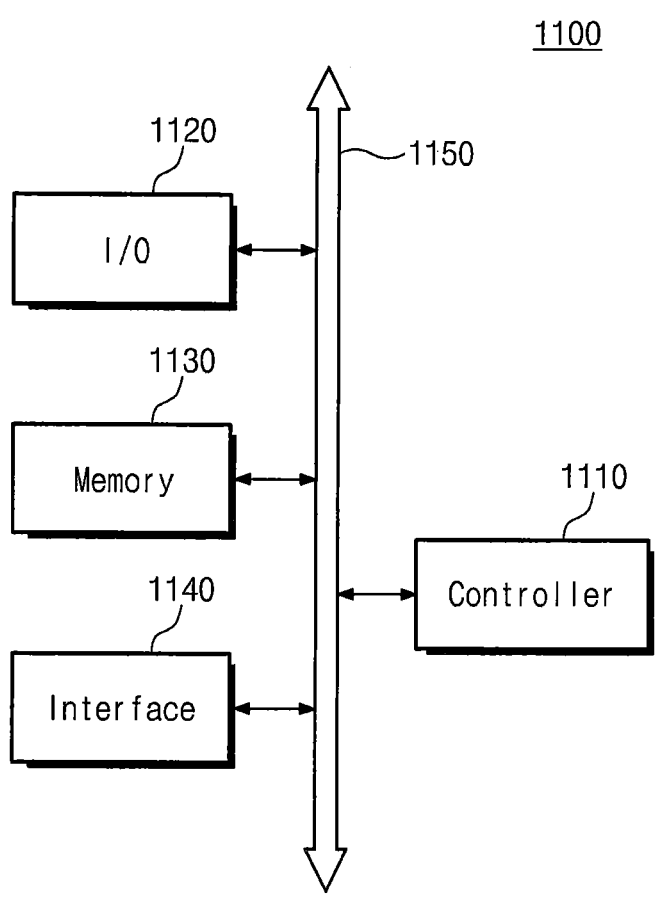
FIG. 19 is a schematic block diagram illustrating electronic systems including a semiconductor memory device according to some embodiments of the inventive concept.

FIG. 19 is a schematic block diagram illustrating electronic systems including a semiconductor memory device according to some embodiments of the inventive concept.

Referring to FIG. 19, an electronic system 1100 according to some embodiments of the inventive concept may include a controller 1110, an input/output (I/O) unit 1120, a memory device 1130, an interface unit 1140 and a data bus 1150. The controller 1110, the I/O unit 1120, the memory device 1130 and the interface unit 1140 may communicate with each other using the data bus 1150. The data bus 1150 may correspond to a path through which electrical signals are transmitted. The controller 1110, the input-output unit 1120, the memory device 1130, and/or the interface 1140 may be configured to include one of semiconductor devices according to some embodiments of the inventive concept.

The controller 1110 may include at least one of a microprocessor, a digital signal processor, a microcontroller or another logic device, which may function similar to any one of the microprocessor, the digital signal processor and the microcontroller. The I/O unit 1120 may include a keypad, a keyboard or a display unit. The memory device 1130 may store data and/or commands. The interface unit 1140 may transmit data to a communication network or may receive data from the communication network. The interface unit 1140 may operate wirelessly or over a wire. For example, the interface unit 1140 may include an antenna for wireless communication or a transceiver for wired communication. The electronic system 1100 may further include a fast DRAM device and/or a fast SRAM device that acts as a cache memory for improving an operation of the controller 1110.

The electronic system 1100 may be applied to a personal digital assistant (PDA), a portable computer, a web tablet, a wireless phone, a mobile phone, a digital music player, a memory card or an electronic product. The electronic product may receive or transmit data wirelessly.

Figure 20:
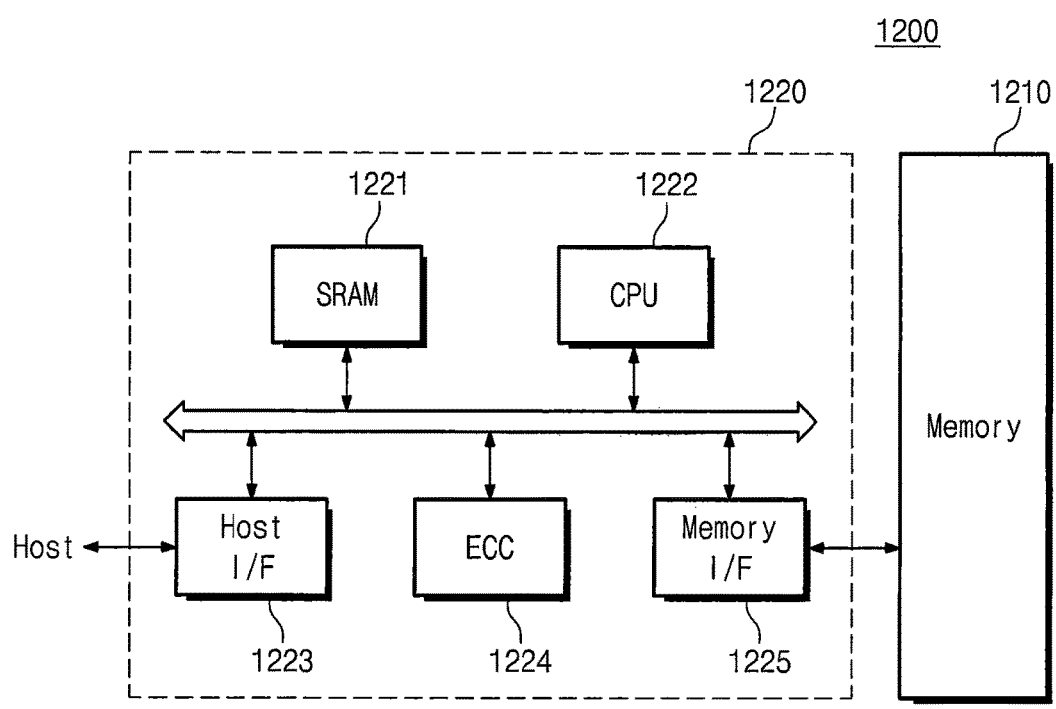
FIG. 20 is a schematic block diagram illustrating memory cards including the semiconductor memory devices according to some embodiments of the inventive concept.

FIG. 20 is a schematic block diagram illustrating memory cards including the semiconductor memory devices according to some embodiments of the inventive concept.

Referring to FIG. 20, a memory card 1200 according to example embodiments of the inventive concept may include a memory device 1210. The memory device 1210 may include at least one of the semiconductor memory devices according to embodiments of the inventive concept. In some embodiments, the memory device 1210 may also include a semiconductor memory device, which is of a different type from the semiconductor memory devices according to embodiments of the inventive concept. For example, the memory device 1210 may further include a nonvolatile memory device and/or a static random access memory (SRAM) device. The memory card 1200 may include a memory controller 1220 that controls data communication between a host and the memory device 1210. The memory device 1210 and/or the memory controller 1220 may be configured to include at least one of the semiconductor devices according to some embodiments of the inventive concept.

The memory controller 1220 may include a central processing unit (CPU) 1222 that controls overall operations of the memory card 1200. In addition, the memory controller 1220 may include an SRAM device 1221 used as an operational memory of the CPU 1222. The memory controller 1220 may further include a host interface unit 1223 and a memory interface unit 1225. The host interface unit 1223 may be configured to include a data communication protocol between the memory card 1200 and the host. The memory interface unit 1225 may connect the memory controller 1220 to the memory device 1210. The memory controller 1220 may further include an error checking and correction (ECC) block 1224. The ECC block 1224 may detect and correct errors in data read from the memory device 1210. The memory card 1200 may further include a read only memory (ROM) device that stores code data to interface with the host. The memory card 1200 may be used as a portable data storage card. Alternatively, the memory card 1200 may be provided in the form of a solid state disk (SSD), instead of hard disks of computer systems.

Figure 21:
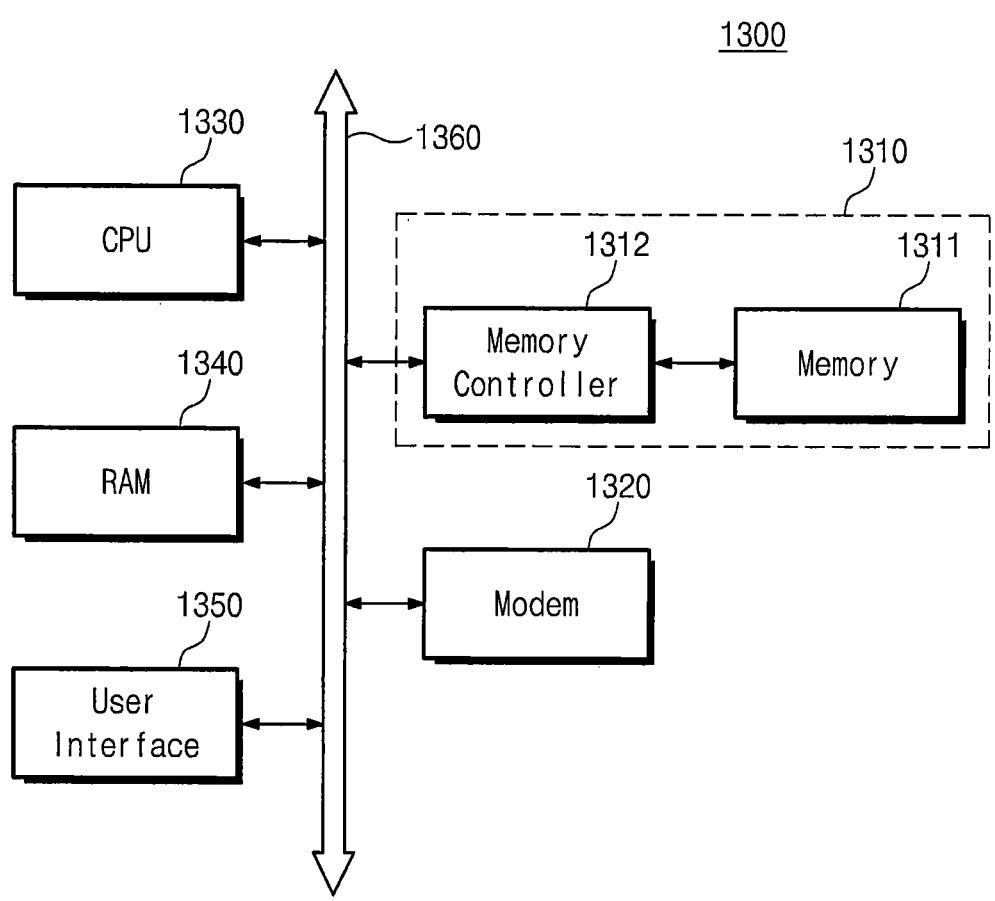
FIG. 21 is a schematic block diagram illustrating information processing systems including a semiconductor memory device according to some embodiments of the inventive concept.

FIG. 21 is a schematic block diagram illustrating information processing systems including a semiconductor memory device according to some embodiments of the inventive concept.

Referring to FIG. 21, an information processing system 1300 includes a memory system 1310, which may include at least one of the semiconductor memory devices according to some embodiments of the inventive concept. The information processing system 1300 also includes a modem 1320, a central processing unit (CPU) 1330, a RAM 1340, and a user interface 1350, which may be electrically connected to the memory system 1310 via a system bus 1360. The memory system 1310 may include a memory device 1311 and a memory controller 1312 controlling an overall operation of the memory device 1311. Data processed by the CPU 1330 and/or input from the outside may be stored in the memory system 1310. Here, the memory system 1310 may be a solid state drive SSD, and thus, the information processing system 1300 may be able to store a large amount of data reliably in the memory system 1310. This increase in reliability may enable the memory system 1310 to conserve resources for error correction and provide high speed data exchange. The information processing system 1300 may be also configured to include an application chipset, a camera image processor (CIS), and/or an input/output device.

According to some embodiments of the inventive concept, a semiconductor memory device may include first memory cells, which are two-dimensionally arranged along rows and columns in a first memory region and are connected in common to a first source line, and second memory cells, which are two-dimensionally arranged along rows and columns in a second memory region and are connected in common to a second source line. Here, the first and second source lines may be provided spaced apart from each other. In the case where all of the first and second memory cells are normal, the first and second source lines may be electrically connected to each other. By contrast, in the case where at least one of the first or second memory cells has failed, the first and second source lines may be electrically separated from each other. Accordingly, an operation for repairing the failed cell can be separately performed on each memory region.

While the embodiments have been described, it will be apparent to those skilled in the art that various changes and modifications may be made without departing from the spirit and scope of the inventive concept. Therefore, it should be understood that the above embodiments are not limiting, but illustrative. Thus the scope of the inventive concept is to be determined by the broadest permissible interpretation of the following claims and their equivalents, and shall not be restricted or limited by the foregoing description.

What is claimed is:

1. A semiconductor memory device, comprising:
a first memory segment including a plurality of first variable resistance memory cells arranged along first and second directions crossing each other;
a first source structure electrically connected in common to the plurality of first variable resistance memory cells, the first source structure including a plurality of first local source lines extending in the first direction and a plurality of first source connection lines extending in the second direction and being connected to the plurality of first local source lines;
a second memory segment, controlled separately from the first memory segment, the second memory segment including a plurality of second variable resistance memory cells arranged along the first and second directions;
a second source structure electrically connected in common to the plurality of second variable resistance memory cells, the second source structure including a plurality of second local source lines extending in the first direction and a plurality of second source connection lines extending in the second direction and being connected to the plurality of second local source lines,
wherein the first and second source structures are physically separated from each other.

2. The device of claim 1 further comprising:
a redundancy memory segment, controlled separately from the first and second memory segments, the redundancy memory segment including a plurality of redundancy memory cells arranged along the first and second directions; and
a redundancy source line electrically connected to the plurality of redundancy memory cells,
wherein the redundancy source line is electrically separated from the first and second source structures.

3. The device of claim 1, further comprising:
a first source line driver connected to the first source structure; and
a second source line driver connected to the second source structure, wherein the first and second source line drivers are responsive to first and second repair signals, respectively.

4. The device of claim 3, wherein the first source line driver is configured to apply a first source line voltage to the first source structure when the first repair signal is in a disable state and is configured to apply a second source line voltage to the first source structure when the repair signal is in an enable state; and
wherein the second source line driver is configured to apply the first source line voltage to the second source structure when the second repair signal is in the disable state and is configured to apply the second source line voltage to the second source line when the second repair signal is in an enable state, wherein the second source line voltage is less than the first source line voltage.

5. The device of claim 1 further comprising:
a plurality of first word lines connected to the plurality of first variable resistance memory cells, respectively, wherein each of the first local source lines is disposed between adjacent ones of the plurality of first variable resistance memory cells parallel to the plurality of first word lines; and a plurality of second word lines connected to the plurality of second variable resistance memory cells, respectively, wherein each of the second local source lines is disposed between adjacent ones of the plurality of second variable resistance memory cells parallel to the plurality of second word lines.

6. The device of claim 1, wherein each of the first and second variable resistance memory cells comprises a variable resistance memory element and a selection element connected thereto, and
the variable resistance memory element is connected between a corresponding bit line and the selection element, and the selection element is connected between the variable resistance memory element and a corresponding one the first and second source structures.

7. The device of claim 1, wherein each of the first and second variable resistance memory cells comprises a variable resistance memory element and a selection element connected thereto, and
the variable resistance memory element is connected between a corresponding one of the first and second source structures and the selection element, and the selection element is connected between the variable resistance memory element and a corresponding bit line.

8. The device of claim 1, wherein each of the first and second variable resistance memory cells comprises a lower magnetic pattern, an upper magnetic pattern, and a tunnel barrier layer between the upper and lower magnetic patterns.

9. The magnetic memory device of claim 1, further comprising a plurality of bit lines extending along one direction, wherein each of the bit lines is electrically connected to ones of the first variable resistance memory cells and ones of the second variable resistance memory cells.

10. A semiconductor memory device, comprising:
a semiconductor substrate, including first and second separately controllable memory regions, on which active portions are defined;
a plurality of word lines on each of the first and second memory regions;
first and second impurity regions in portions of the active portions at both sides of each of the word lines;
a plurality of bit lines orthogonally crossing the word lines on both of the first and second memory regions, each of the bit lines being coupled to ones of the first impurity regions located thereunder;
a plurality of variable resistance memory cells located at respective intersections of the word lines and the bit lines;
a plurality of first local source lines extending parallel to the word lines and provided in the first memory region, each of the first local source lines electrically connected in common to ones of the second impurity regions located thereunder
a plurality of second local source lines extending parallel to the word lines and provided in the second memory region, each of the second local source lines electrically connected in common to ones of the second impurity regions located thereunder;
a first source line connected in common to the plurality of first local source lines on the first memory region; and
a second source line connected in common to the plurality of second local source lines on the second memory region.

11. The device of claim 10, further comprising:
a plurality of first source connection lines on the first memory region extending parallel to the bit lines and spaced-apart from each other in a direction parallel to the plurality of word lines, the first source connection lines connected to the first local source lines; and
a plurality of second source connection lines provided on the second memory region extending parallel to the bit lines and spaced apart from each other in the direction parallel to the plurality of word lines, the second source connection lines connected to the second local source lines.

12. A magnetic memory device, comprising:
a plurality of separately controllable magnetic memory segments configured to store data;
a plurality of separately controllable source lines, each being coupled to a respective one of the plurality of separately controllable magnetic memory segments; and
a plurality of separately controllable source line driver circuits, each being coupled to a respective one of the plurality of separately controllable source lines,
wherein each of the plurality of separately controllable source line driver circuits is coupled to a respective one of a plurality of separately controllable repair enable signals;
wherein each of the plurality of separately controllable source line driver circuits is configured to drive a first source line voltage signal to the respective one of the plurality of separately controllable source lines responsive to the respective one of the plurality of separately controllable repair enable signals being disabled; and
wherein each of the plurality of separately controllable source line driver circuits is configured to drive a second source line voltage signal to the respective one of the plurality of separately controllable source lines responsive to the respective one of the plurality of separately controllable repair enable signals being enabled.

13. The magnetic memory device of claim 12 further comprising:
a repair circuit configured to enable or disable each of the plurality of separately controllable repair enable signals separately from one another.

14. The magnetic memory device of claim 12 further comprising:
a respective plurality of word lines in each of the plurality of separately controllable magnetic memory segments; and
a respective plurality of magnetic memory cells in each of the plurality of separately controllable magnetic memory segments, the respective plurality of word lines being coupled to the respective plurality of magnetic memory cells.

15. The magnetic memory device of claim 14 wherein a word line enable voltage level for the word lines is about equal to a repair enable voltage level for the separately controllable repair enable signals being enabled.

16. The magnetic memory device of claim 12 further comprising:
a separately controllable redundancy magnetic memory segment configured to store the data addressed to a failed one of the plurality of separately controllable magnetic memory segments; and
a separately controllable redundancy source line coupled to the separately controllable redundancy magnetic memory segment.

17. The magnetic memory device of claim 16 further comprising:
a separately controllable redundancy source line driver circuit, coupled to the separately controllable redundancy source line.

18. The magnetic memory device of claim 17 wherein the separately controllable redundancy source line driver circuit is configured to drive a first source line voltage to the separately controllable redundancy source line responsive to the separately controllable redundancy source line driver circuit being enabled by a first state of a repair enable signal; and
wherein the separately controllable redundancy source line driver circuit is configured to drive a second source line voltage to the separately controllable redundancy source line responsive to the separately controllable redundancy source line driver circuit being disabled by a second state of the repair enable signal.

* * * * *